(12) United States Patent
Umemoto et al.

(10) Patent No.: US 11,631,758 B2
(45) Date of Patent: Apr. 18, 2023

(54) SEMICONDUCTOR DEVICE

(71) Applicant: Murata Manufacturing Co., Ltd., Kyoto-fu (JP)

(72) Inventors: Yasunari Umemoto, Nagaokakyo (JP); Isao Obu, Nagaokakyo (JP); Kaoru Ideno, Nagaokakyo (JP); Shigeki Koya, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 481 days.

(21) Appl. No.: 16/810,492

(22) Filed: Mar. 5, 2020

(65) Prior Publication Data
US 2020/0287027 A1 Sep. 10, 2020

(30) Foreign Application Priority Data

Mar. 6, 2019 (JP) .............................. JP2019-040690
Oct. 17, 2019 (JP) .............................. JP2019-190441

(51) Int. Cl.
*H01L 29/08* (2006.01)
*H01L 29/06* (2006.01)
*H01L 29/737* (2006.01)

(52) U.S. Cl.
CPC ........ *H01L 29/737* (2013.01); *H01L 29/0626* (2013.01); *H01L 29/0817* (2013.01)

(58) Field of Classification Search
CPC ....... H01L 29/06; H01L 29/08; H01L 29/626; H01L 29/0817; H01L 29/737
See application file for complete search history.

(56) References Cited

U.S. PATENT DOCUMENTS

| | | | | |
|---|---|---|---|---|
| 5,614,423 A | * | 3/1997 | Matsuoka | H01L 29/66318 257/E21.387 |
| 7,829,917 B1 | * | 11/2010 | Thomas | H01L 29/0692 257/197 |
| 2002/0105011 A1 | * | 8/2002 | Yaegashi | H01L 29/7371 257/E29.189 |
| 2016/0293742 A1 | * | 10/2016 | Watanabe | H01L 29/66242 |

FOREIGN PATENT DOCUMENTS

| JP | 2002-246587 A | 8/2002 |
|---|---|---|
| JP | 2005-101402 A | 4/2005 |

* cited by examiner

*Primary Examiner* — Matthew E Warren
(74) *Attorney, Agent, or Firm* — Studebaker & Brackett PC

(57) ABSTRACT

A semiconductor device includes a collector layer, a base layer, and an emitter layer that are disposed above a substrate. An emitter mesa layer is disposed on a partial region of the emitter layer. In a plan view, the base electrode is disposed in or on a region which does not overlap the emitter mesa layer. The base electrode allows base current to flow to the base layer. In the plan view, a first edge forming part of edges of the emitter mesa layer extends in a first direction, and a second edge forming part of edges of the base electrode faces the first edge. A gap between the first edge and the second edge in a terminal portion located in an end portion of the emitter mesa layer in the first direction is wider than a gap in an intermediate portion of the emitter mesa layer.

20 Claims, 24 Drawing Sheets

SEMICONDUCTOR DEVICE

CROSS-REFERENCE TO RELATED APPLICATIONS

This application claims benefit of priority to Japanese Patent Application No. 2019-040690, filed Mar. 6, 2019, and to Japanese Patent Application No. 2019-190441, filed Oct. 17, 2019, the entire content of each is incorporated herein by reference.

BACKGROUND

Technical Field

The present disclosure relates to a semiconductor device.

Background Art

Hitherto, hetero-junction bipolar transistors (HBTs) have been used as active elements included in the power amplifier module of a mobile terminal, as described in Japanese Unexamined Patent Application Publication No. 2005-101402. Desirable characteristics required for the HBTs are high efficiency, high gain, high output, high voltage resistance, and the like. An envelope tracking system recently drawing attention requires an HBT that operates at a high collector voltage. To achieve the high-voltage operation in the HBT, the safe operating area (SOA) of the HBT needs to be enlarged.

SUMMARY

In a graph representing a collector current-collector voltage characteristic (Ic-Vce characteristic), an increase in collector voltage in a HBT involves with gradual descent of the boundary (a SOA line) between regions within and beyond the SOA. Evaluation experiments performed by the inventors of the present application prove that an event of ungradual descent of the SOA line at a certain collector voltage occurs. A collector voltage at which the SOA line descends ungradually is herein referred to as a transition voltage. Note that a characteristic leading to the ungradual descent of the SOA line will be described later with reference to FIG. 12.

If the operating voltage is increased to a voltage approximately equal to or higher than a transition voltage, load fluctuation occurrence during HBT operation causes the actual operating range to fall beyond the SOA. The falling of the operating range largely beyond the SOA causes a damage to the HBT in some cases. Accordingly, to operate the HBT at a high collector voltage without damage even in load fluctuation occurrence, it is desirable to enlarge the SOA by raising the transition voltage.

Accordingly, the present disclosure provides a semiconductor device enabled to enlarge an SOA by raising a transition voltage.

According to preferred embodiments of the present disclosure, there is provided a semiconductor device including a collector layer; a base layer; an emitter layer; and an emitter mesa layer disposed in a partial region of the emitter layer. The collector layer, the base layer, the emitter layer, and the emitter mesa layer are disposed above a substrate. The collector layer, the base layer, and the emitter layer are stacked in this order.

The semiconductor device further includes a base electrode disposed in or on a region which does not overlap the emitter mesa layer in a plan view and that allows base current to flow to the base layer. The emitter mesa layer has a first edge extending in a first direction in the plan view. The base electrode has a second edge extending in the first direction in the plan view. The second edge of the base electrode faces the first edge of the emitter mesa layer, and a gap between the first edge and the second edge in a terminal portion located in an end portion of the emitter mesa layer in the first direction is wider than a gap between the first edge of the emitter mesa layer and the second edge in an intermediate portion in the first direction.

With the configuration in which the gap between the first edge and the second edge in the terminal portion located in the end portion of the emitter mesa layer in the first direction is wider than the gap in the intermediate portion of the emitter mesa layer, base access resistance per unit length in the terminal portion is higher than base access resistance per unit length in the intermediate portion. The base current increase causes a net base-emitter voltage in the terminal portion to be lower than a net base-emitter voltage in the intermediate portion due to a voltage drop caused by the base access resistance. As the result, a region where emitter current mainly flows is chiefly limited to the intermediate portion of the emitter mesa layer at the high-current operation, and the stability of the location of the region where the emitter current mainly flows is enhanced. The region where the emitter current mainly flows is thereby less likely to shift in the emitter mesa layer. This enables the transition voltage to rise and the SOA to be enlarged.

Other features, elements, characteristics and advantages of the present disclosure will become more apparent from the following detailed description of preferred embodiments of the present disclosure (with reference to the attached drawings).

DETAILED DESCRIPTION

Before the explanation of embodiments, with reference to FIGS. 1 to 3, one of factors of SOA enlargement prevention in a typical HBT will be described based on evaluation experiments performed by the inventors of the present application.

Figure 1:
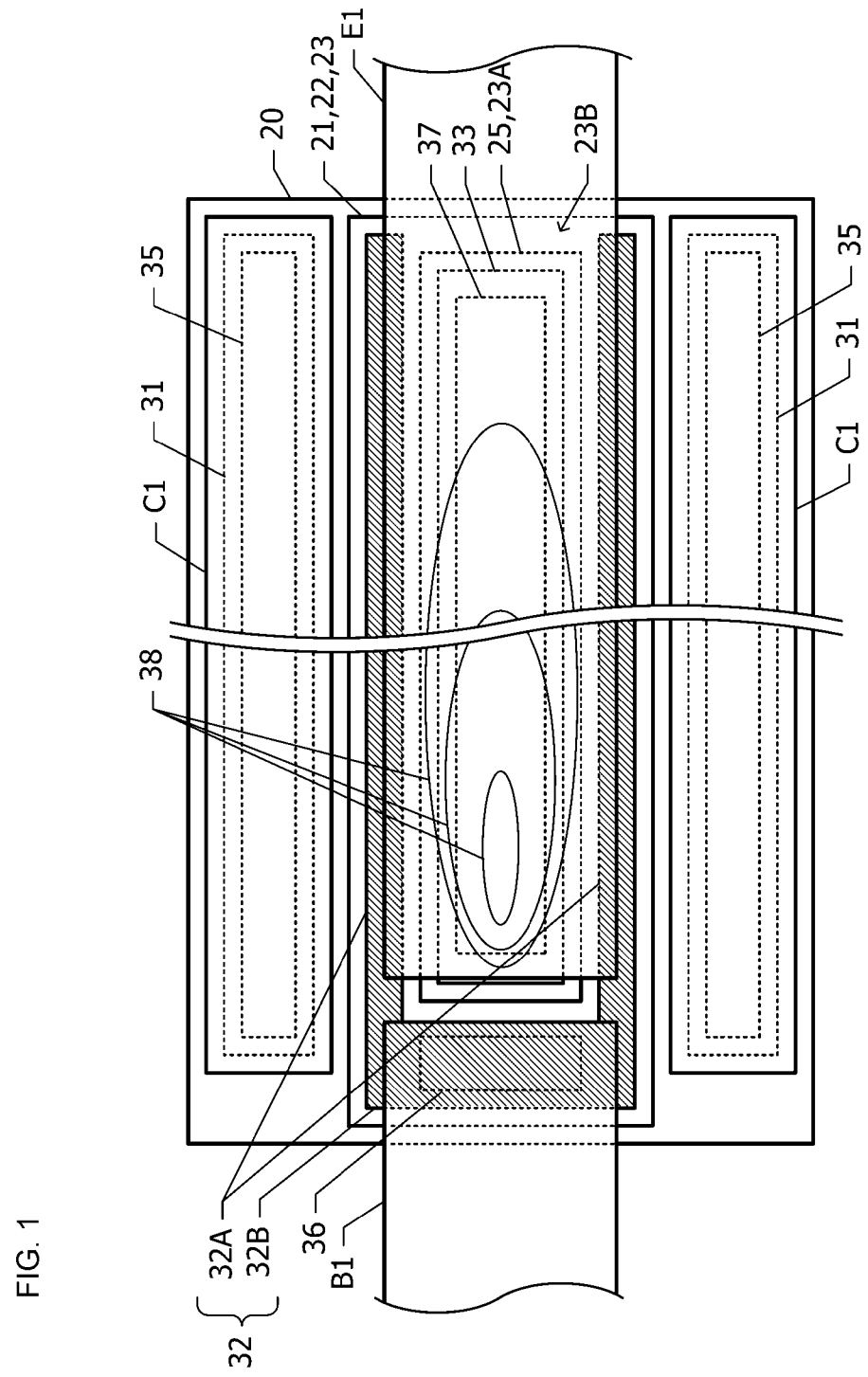
FIG. 1 is a plan view of a HBT according to a reference example that undergoes evaluation experiments.

FIG. 1 is a plan view of a HBT according to a reference example that undergoes evaluation experiments. A subcollector layer 20 that is a conductive semiconductor is disposed on a surface layer portion of a substrate. Above the subcollector layer 20, a collector layer 21, a base layer 22, and an emitter layer 23 are disposed. The collector layer 21, the base layer 22, and the emitter layer 23 almost completely overlap in a plan view and are disposed inward of the subcollector layer 20 in the plan view. An emitter mesa layer 25 is disposed in a partial region of the emitter layer 23. In the plan view, the emitter mesa layer 25 is disposed inward of the emitter layer 23. The collector layer 21, the base layer 22, the emitter layer 23, and the emitter mesa layer 25 are used to form a bipolar transistor, for example, a HBT.

The emitter mesa layer 25 has a planar shape extending in one direction (a lateral direction in FIG. 1) in the plan view. For example, the planar shape of the emitter mesa layer 25 is substantially a rectangle. An emitter electrode 33 is disposed on the emitter mesa layer 25. In the plan view, the emitter electrode 33 is disposed inward of the emitter mesa layer 25. The emitter electrode 33 is formed from a metal and is in ohmic contact with the emitter mesa layer 25.

In the plan view, a region of the emitter layer 23 overlaps the emitter mesa layer 25, and the region operates as the emitter of the HBT. Of the emitter layer 23, the region overlapping the emitter mesa layer 25 herein refers to an intrinsic emitter layer 23A. Of the emitter layer 23, a region not overlapping the emitter mesa layer 25 in the emitter layer 23 in the plan view is referred to as a ledge layer 23B.

A base electrode 32 is disposed on the ledge layer 23B. The base electrode 32 is alloyed and connected to the base layer 22 via the ledge layer 23B. The base electrode 32 allows base current to flow to the base layer 22. The base electrode 32 is hatched in FIG. 1. The base electrode 32 includes two base-electrode main portions 32A and a base-electrode pad portion 32B. The two base-electrode main portions 32A are disposed at respective mutually opposite sides of the emitter mesa layer 25 in a width direction in the plan view and extend in the longitudinal direction of the emitter mesa layer 25. The base-electrode pad portion 32B causes the two base-electrode main portions 32A to connect to each other in an outer side portion of an end portion of the emitter mesa layer 25 in the longitudinal direction (the left end of the emitter mesa layer 25 in FIG. 1). The base electrode 32 composed of the base-electrode main portions 32A and the base-electrode pad portion 32B surrounds the emitter mesa layer 25 substantially in a U-letter shape.

Collector electrodes 31 are disposed inward of the subcollector layer 20 and at the respective mutually opposite sides of the collector layer 21. Each collector electrode 31 has a planar shape extending in the longitudinal direction of the emitter mesa layer 25. The collector electrode 31 is connected to the collector layer 21 by using the subcollector layer 20.

An insulating film is disposed over the collector electrodes 31, the base electrode 32, and the emitter electrode 33. In the plan view, collector wiring lines C1, a base wiring line B1, and an emitter wiring line E1 are disposed on the insulating film in such a manner as to respectively overlap the collector electrodes 31, the base-electrode pad portion 32B, and the emitter electrode 33. The collector wiring lines C1 are respectively connected to the collector electrodes 31 with collector apertures 35 placed therebetween, the collector apertures 35 being provided in the insulating film under the collector wiring lines C1. The base wiring line B1 is connected to the base electrode 32 with a base aperture 36 placed therebetween, the base aperture 36 being provided in the insulating film under the base wiring line B1. The emitter wiring line E1 is connected to the emitter electrode 33 with an emitter aperture 37 placed therebetween, the emitter aperture 37 being provided in the insulating film under the emitter wiring line E1.

The emitter aperture 37 is disposed inward of the emitter electrode 33 in the plan view and has a planar shape extending in the longitudinal direction of the emitter mesa layer 25. Each collector apertures 35 is disposed inward of the corresponding collector electrode 31 in the plan view and has a planar shape extending in the longitudinal direction of the collector electrode 31. The base aperture 36 is disposed inward of the base-electrode pad portion 32B in the plan view.

The emitter wiring line E1 is extended in a direction away from the base-electrode pad portion 32B. The base wiring line B1 is extended in a direction away from the emitter mesa layer 25. A wiring line in a second layer is further disposed on each of the emitter wiring line E1, the collector wiring lines C1, and the base wiring line B1 in some cases.

In the plan view, the emitter mesa layer 25, the emitter electrode 33, and the emitter aperture 37 are symmetrical in each of the longitudinal direction and the width direction. In addition, gaps between edges of the emitter mesa layer 25 and corresponding edges of each base-electrode main portion 32A are almost constant.

Generally, to ensure a large current flow region in the emitter mesa layer 25 and the intrinsic emitter layer 23A, the area of the emitter electrode 33 is designed as largely as possible. For example, a gap between the outer edge of the emitter mesa layer 25 and the outer edge of the emitter electrode 33 is designed to have a distance equal to or shorter than about 1 μm. FIG. 1 conceptually illustrates example distribution of emitter current isolines 38 by using thin solid lines. As described above, the magnitude of the emitter current is not uniform in the plan view and is expressed as certain distribution. The distribution of the emitter current isolines 38 are described in detail later.

If a monolithic microwave integrated circuit element (MMIC) having a power amplifier integrated therein includes the HBT illustrated in FIG. 1, a plurality of HBTs are disposed per MMIC formed on one semiconductor substrate. The plurality of HBTs are electrically connected to each other directly by using the emitter wiring line E1, the collector wiring lines C1, the base wiring line B1, the wiring lines in the respective second layers thereon, and the like, or indirectly with elements such as resistors interposed therebetween. Power amplifiers in the power stage or the driver stage are thereby formed.

Figure 2:
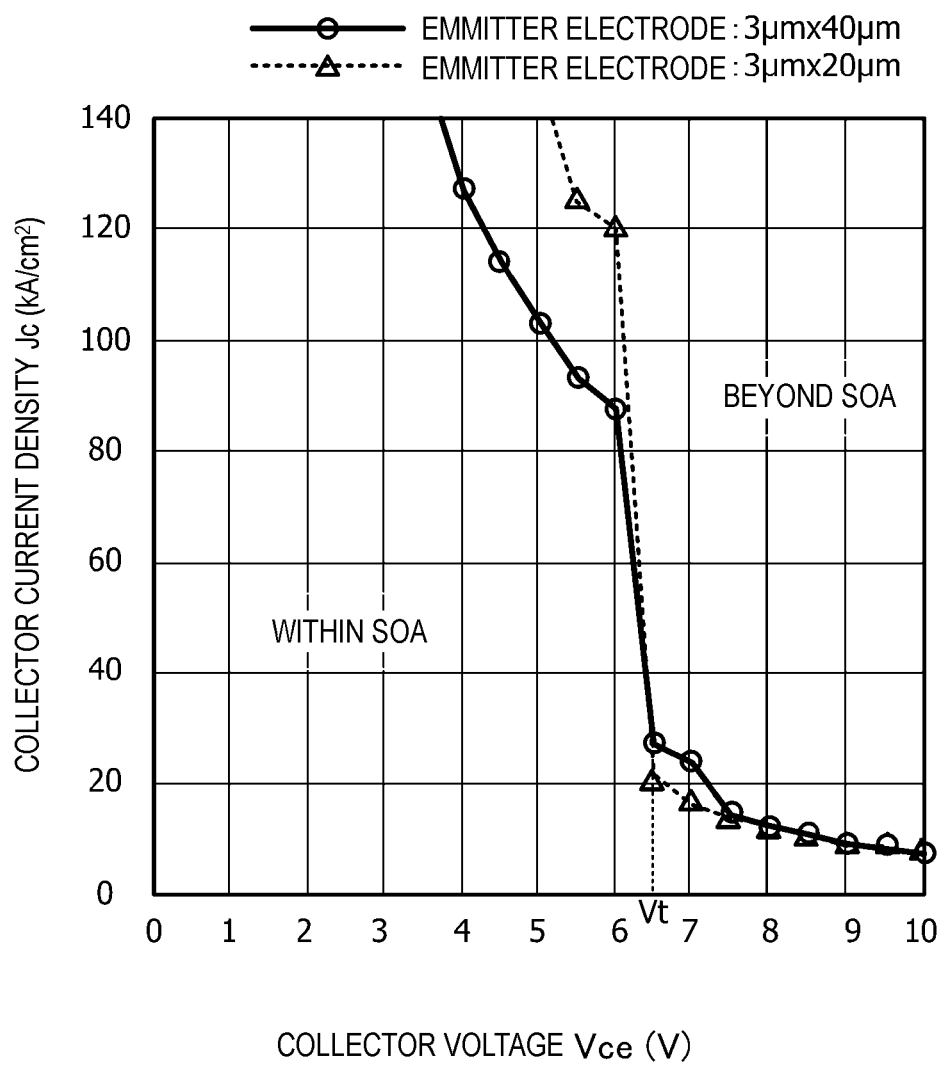
FIG. 2 is a graph representing the results of actual measurements of the SOA line of the HBT.

FIG. 2 is a graph representing the results of actual measurements of the SOA line of the HBT. The horizontal axis represents a collector voltage Vce by using the unit "V", and the vertical axis represents a collector current density Jc by using the unit "kA/cm$^2$". Circles and triangles in the graph represent SOA lines of respective emitter samples in different dimensions. In FIG. 2, the circles and the solid line in the graph represent the results of actual measurements of a sample with the emitter electrode 33 about 3 μm wide and about 40 μm long, and the triangles and the broken line represent the results of actual measurements of a sample with the emitter electrode 33 about 3 μm wide and about 20 μm long. The region on the low voltage side of the SOA line corresponds to the SOA.

It is understood that when the collector voltage Vce increases from about 6V to about 6.5V, the SOA line drops ungradually and sharply. The collector voltage Vce at the ungradual drop of the SOA line corresponds to a transition voltage Vt.

In the reference examples illustrated in FIGS. 1 and 2, there are one emitter electrode 33 and two base-electrode main portions 32A; however, HBTs with different combinations of the number of emitter electrodes 33 and the number of base-electrode main portions 32A also exhibit ungradual descent of the SOA line. For example, a HBT with one emitter electrode 33 and one base-electrode main portion 32A, a HBT with two emitter electrodes 33 and one base-electrode main portion 32A, a HBT with two emitter electrodes 33 and three base-electrode main portions 32A, and a HBT with three emitter electrodes 33 and four base-electrode main portions 32A also exhibit ungradual descent of the SOA line.

Figure 3:
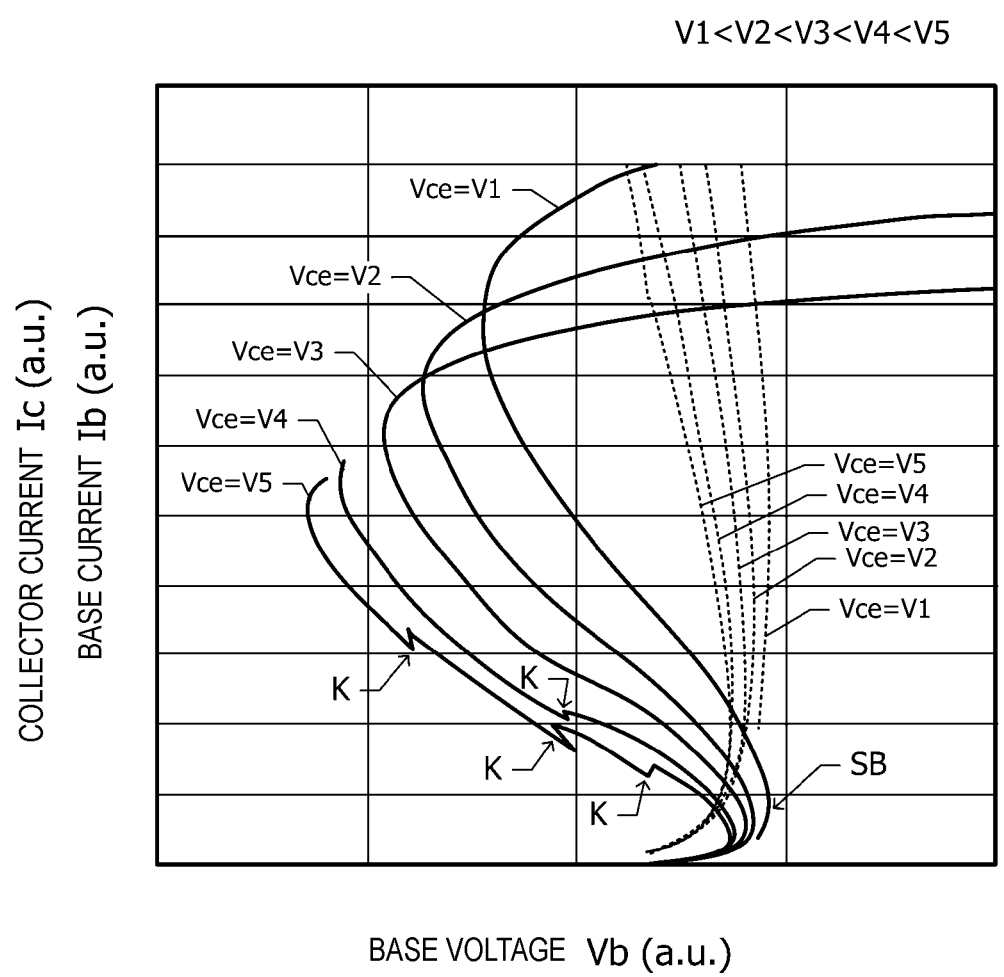
FIG. 3 is a graph representing the actual measurement results of a collector current-base voltage characteristic (Ic-Vb characteristic) and a base current-base voltage characteristic (Ib-Vb characteristic)

FIG. 3 is a graph representing the actual measurement results of the collector current-base voltage characteristic (Ic-Vb characteristic) and the base current-base voltage characteristic (Ib-Vb characteristic). The horizontal axis represents a base voltage Vb by using any unit, and the vertical axis represents a collector current Ic and a base current Ib by using any unit. In FIG. 3, the solid line and the broken line respectively represent the Ic-Vb characteristic and the Ib-Vb characteristic. Note that the scale of the vertical axis representing the collector current Ic is different from the scale of the vertical axis representing the base current Ib. The base voltage Vb and the collector current Ic are measured while the magnitude of the base current Ib is swept based on the current source. The measurements are performed by using a plurality of voltages each corresponding to the collector voltage Vce=V1, V2, V3, V4, or V5. The magnitude relationship among voltages V1 to V5 is expressed as V1<V2<V3<V4<V5.

As illustrated in FIG. 3 by using the solid lines, the collector current Ic increases monotonously in a low range of the collector current Ic with the increase of the base voltage Vb, and the inclination of the collector current Ic with respect to the base voltage Vb gradually increases. Likewise, as represented in FIG. 3 by using the broken lines, the inclination of the base current Ib also gradually increases. A further increase of the collector current Ic leads to a snapback point SB where the inclination of the collector current Ic with respect to the base voltage Vb becomes infinite. At this time, each inclination of the base current Ib in the broken line also becomes infinite. As the collector current Ic is increased beyond the snapback point SB, each inclination of the collector current Ic and the base current Ib with respect to the base voltage Vb in the solid line and the broken line, respectively, changes to the negative side. With the increase of each collector current Ic in the solid line and each base current Ib in the broken line, the corresponding base voltage Vb decreases.

As illustrated in FIG. 3 by using the solid lines, in the case where the collector voltage Vice is any one of V4 and V5, a kink K appears after the collector current Ic passes the snapback point SB. In the kink K, the collector current Ic ungradually descends. In the case where the collector voltage Vice is any one of V1, V2, and V3 that is lower than V4 and V5, the kink K does not appear. The minimum collector voltage Vice at which the kink K appears corresponds to the transition voltage Vt (FIG. 2). The kink K refers to a distinguishing region where, in the Ic-Vb characteristic, the base voltage Vb increases temporarily or the collector current Ic decreases temporarily, in the region where the base voltage Vb tends to decrease and the collector current Ic tends to increase (see FIG. 3).

The reason why the kink K appears in the region beyond the snapback point SB in the collector current-base voltage characteristic will be described.

It is projected that the appearance of the kink K is caused by the thermal or electrical asymmetry of the HBT. The arrangement of the emitter electrode 33 and the emitter aperture 37 is symmetrical in the portion inward of the emitter mesa layer 25 (FIG. 1). However, around the emitter mesa layer 25, the base electrode 32, various wiring lines, and other components are arranged asymmetrically with respect to the emitter mesa layer 25. In a bird view of the arrangement of a plurality of HBTs for the power amplifier in the power stage and the driver stage, extended wires, circuit elements, via holes, and other components therearound, there is a factor in thermal or electrical asymmetry with respect to a focused one emitter mesa layer 25.

Before the collector current Ic reaches the snapback point SB, the current distribution of the region where an emitter current Ie mainly flows has the maximum value near the center in the longitudinal direction of the emitter mesa layer 25 (FIG. 1) and extends toward both sides in the longitudinal direction. After the collector current Ic is increased after exceeding the snapback point SB, the asymmetry factors around the emitter mesa layer 25 cause the current distribution of the region where the emitter current Ie mainly flows to change to exhibit the maximum value position displaced lengthwise from the position near the center of the emitter mesa layer 25 (FIG. 1). For example, the distribution of the emitter current isolines 38, as illustrated in FIG. 1, localizes in a portion on the side of the base-electrode pad portion 32B, shifted from a portion near the center. The term "asymmetry" is herein used to denote a factor causing the region where the emitter current Ie mainly flows to have a current maximum value position displaced lengthwise from the position near the center of the emitter mesa layer 25 (FIG. 1). It is conceived that the displacement of the current maximum value position in the region where the emitter current Ie mainly flows causes the appearance of the kink K (FIG. 3). In embodiments described below, the current maximum value position in the region where the emitter current Ie mainly flows is less likely to be influenced by the factor of the asymmetry around the emitter mesa layer 25.

First Embodiment

A semiconductor device according to a first embodiment will be described with reference to FIGS. 4 to 8. Hereinafter, the configuration common to the configuration of the semiconductor device according to the reference example illustrated in FIG. 1 is not described.

Figure 4:
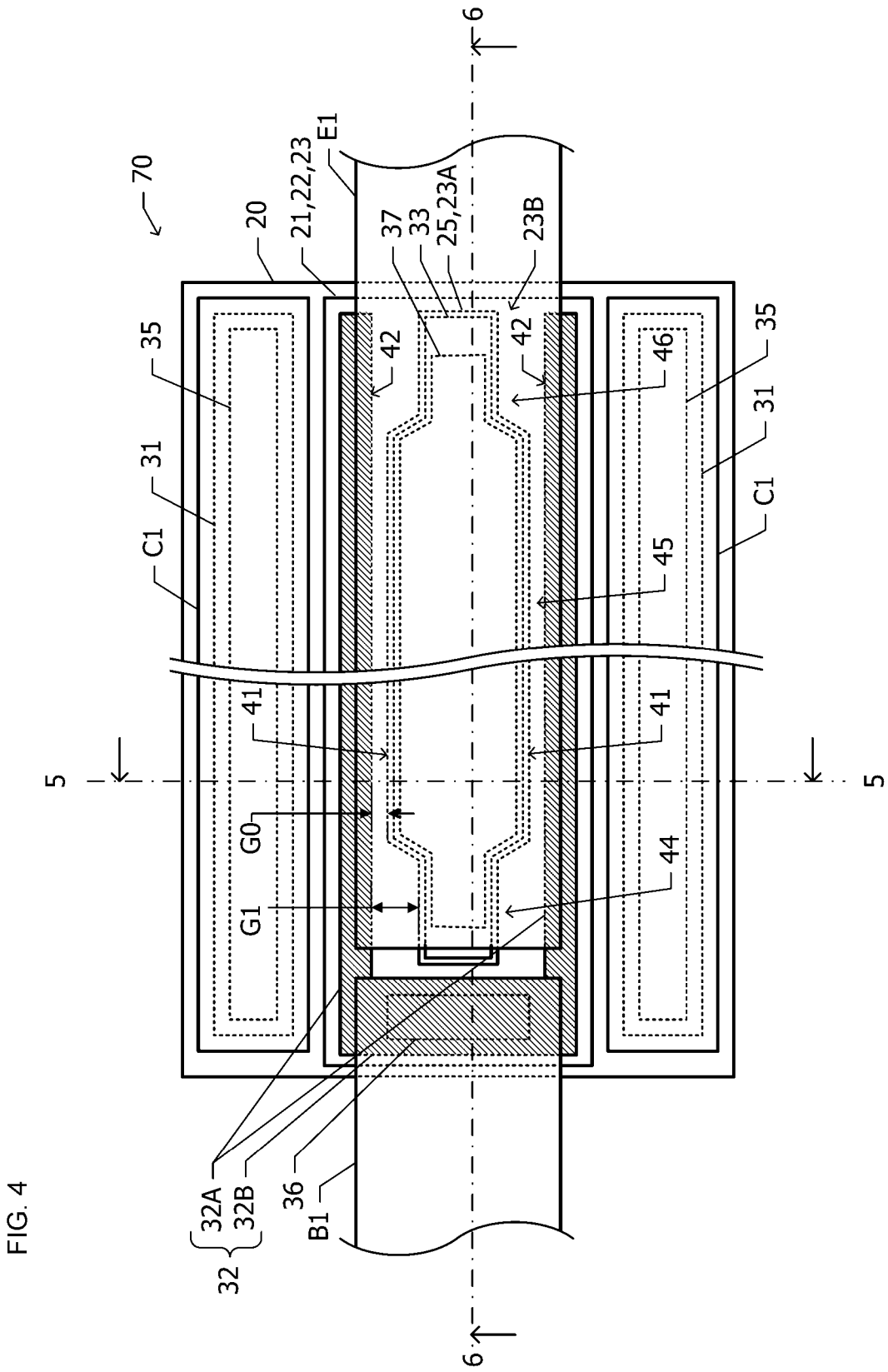
FIG. 4 is a plan view of one of a plurality of unit transistors included in a semiconductor device according to a first embodiment.

FIG. 4 is a plan view of one of a plurality of unit transistors 70 included in the semiconductor device according to the first embodiment. The emitter mesa layer 25 has a shape extending in one direction in a plan view. The longitudinal direction of the emitter mesa layer 25 is referred to as a first direction. In the plan view, first edges 41 are respectively located at both sides of the emitter mesa layer 25 in the width direction. Each first edge 41 extends in the first direction. Second edges 42 are each one of edges of each of the two base-electrode main portions 32A of the base electrode 32 and faces a corresponding one of the first edges 41. Each second edge 42 extends in the first direction. The facing of the first edge 41 and the second edge 42 each other in the plan view denotes the arrangement where the two edges face each other. The state where the two edges face each other includes not only a state where the two edges are parallel to each other but also a state the two edges have an oblique positional relationship.

A gap G1 between the first edge 41 and the second edge 42 in an terminal portion 44, of the emitter mesa layer 25, closer to the base-electrode pad portion 32B (the terminal portion 44 of the emitter mesa layer 25 close to the base-electrode pad potion 32B is also called a first terminal portion of the emitter mesa layer) is wider than a gap G0 between the first edge 41 and the second edge 42 in an intermediate portion 45 of the emitter mesa layer 25. More specifically, the second edge 42 is a straight line extending in the first direction, and the first edge 41 in the terminal portion 44 is disposed at a position receded farther than that of the first edge 41 in the intermediate portion 45 in a direction away from the second edge 42. The first edge 41 has a substantially bending shape. The term "terminal portion" denotes a portion located at each end in the first direction, and the term "intermediate portion" denotes a portion between the terminal portions at the respective opposite ends.

In an terminal portion 46 farther from the base-electrode pad portion 32B (the terminal portion 46 of the emitter mesa layer 25 farther from the base-electrode pad potion 32B is also called a second terminal portion of the emitter mesa layer), shapes of and the positional relationship between the first edge 41 and the second edge 42 are the same as the shapes thereof and the positional relationship therebetween in the terminal portion 44 closer to the base-electrode pad portion 32B. Accordingly, the emitter mesa layer 25 has a narrower planer shape in the terminal portions 44 and 46 at the respective ends than that in the intermediate portion 45.

The shortest distance from an edge of the base-electrode pad portion 32B to an edge of the emitter wiring line E1 is longer than the shortest distance from the edge of the base-electrode pad portion 32B to an edge of the emitter mesa layer 25. In other words, an end portion, of the emitter mesa layer 25, closer to the base-electrode pad portion 32B projects in the first direction toward the base-electrode pad portion 32B from an end portion, of the emitter wiring line E1, closer to the base-electrode pad portion 32B. Accordingly, there is a region not covered with the emitter wiring line E1 in the end portion, of the emitter mesa layer 25, closer to the base-electrode pad portion 32B.

Figure 5:
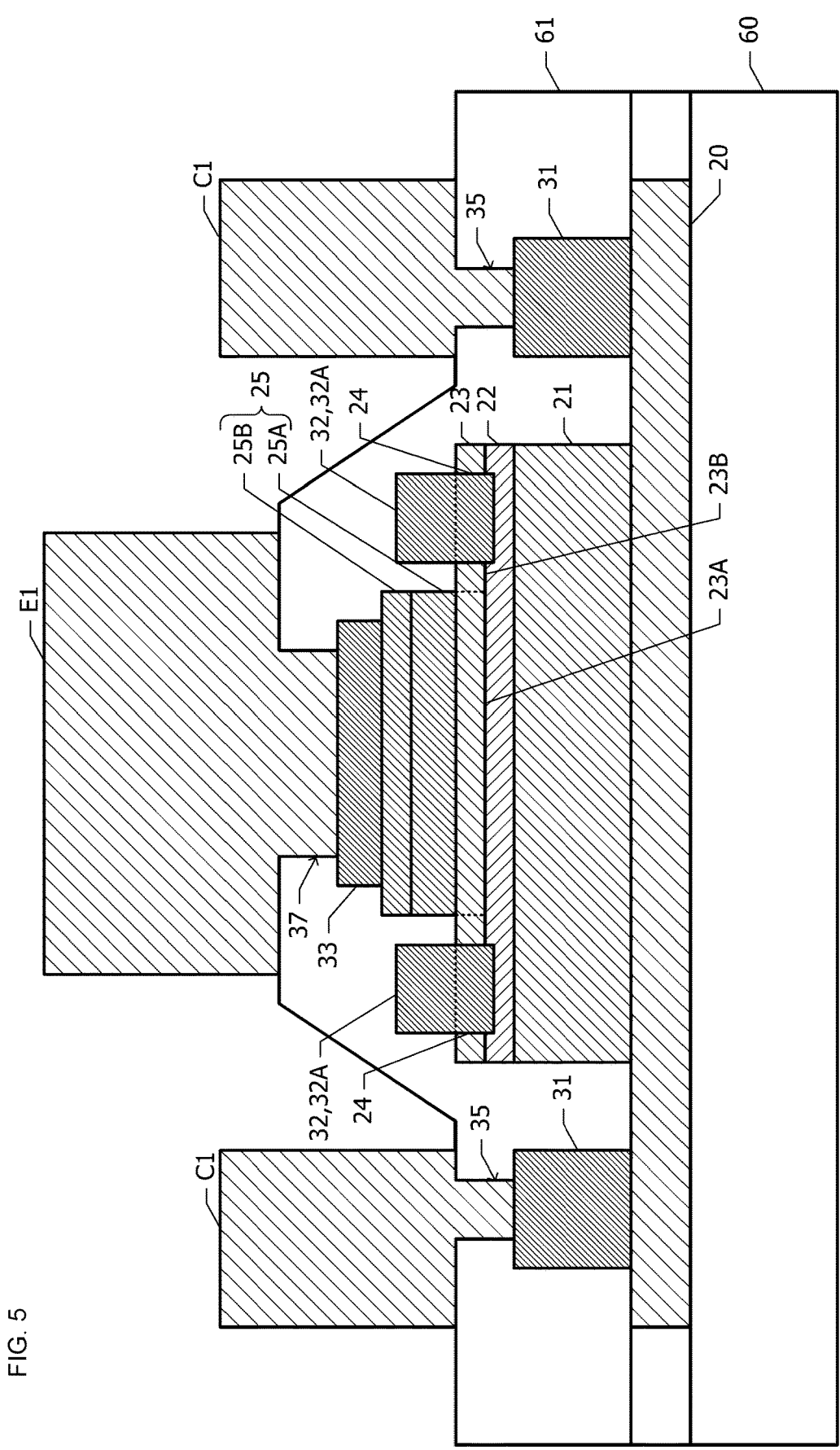
FIG. 5 is a cross-sectional view taken along the alternate long and short dash line 5-5 in FIG. 4.

FIG. 5 is a cross-sectional view taken along the alternate long and short dash line 5-5 in FIG. 4. An n-type GaAs layer is disposed on a substrate 60 formed from semi-insulating GaAs, and part of the n-type GaAs layer is insulated by ion implantation technology. The subcollector layer 20 is composed of the other part of the not insulated n-type GaAs layer. Of both surfaces of the substrate 60, the one surface where the subcollector layer 20 is formed is referred to as a main surface. The collector layer 21, the base layer 22, and the emitter layer 23 are stacked in this order above a partial region of the subcollector layer 20. The emitter mesa layer 25 is disposed in a partial region of the emitter layer 23. The emitter layer 23 is separated into the intrinsic emitter layer 23A immediately below the emitter mesa layer 25 and the ledge layer 23B not covered with the emitter mesa layer 25. In the plan view, the intrinsic emitter layer 23A almost overlaps the emitter mesa layer 25, and operating current mainly flows through the intrinsic emitter layer 23A. Note that the phrase "in a plan view" herein denotes a state where the main surface of the substrate 60 is viewed from above in a direction orthogonal to the main surface of the substrate 60. The emitter mesa layer 25 includes a capping layer 25A and a contact layer 25B disposed on the capping layer 25A. The capping layer 25A is located closer to the emitter layer 23 than the contact layer 25B is.

The collector layer 21 is formed from n-type GaAs, and the base layer 22 is formed from p-type GaAs. Sheet resistance ρs of the base layer 22 is, for example, about from 130Ω/sq. to 400Ω/sq. inclusive. The emitter layer 23 is formed from n-type InGaP with, for example, Si doping density from about $2\times10^{17}$ cm$^{-3}$ to about $5\times10^{17}$ cm$^{-3}$ inclusive and has a thickness from about 20 nm to about 50 nm inclusive. The capping layer 25A is formed from, for example, n-type GaAs with Si doping density from about $2\times10^{18}$ cm$^{-3}$ to about $4\times10^{18}$ cm$^{-3}$ inclusive and has a thickness from about 50 nm to about 200 nm inclusive. The contact layer 25B is formed from, for example, n-type InGaAs Si doping density from about $1\times10^{19}$ cm$^{-3}$ to about $3\times10^{19}$ cm$^{-3}$ inclusive and has a thickness from about 100 nm to about 200 nm inclusive. Note that another compound semiconductor may be used as any of these semiconductor layers.

The collector electrodes 31 are disposed on the subcollector layer 20. The collector electrodes 31 are disposed at the respective mutually opposite sides of the collector layer 21 in the cross section illustrated in FIG. 5. The base electrode 32 disposed on the ledge layer 23B is connected to the base layer 22 through an alloy layer 24 penetrating the ledge layer 23B. The alloy layer 24 is alloyed in such a manner that the material of the base electrode 32 is diffused in the ledge layer 23B in the heat treatment process. In the cross section illustrated in FIG. 5, one of the base-electrode main portions 32A (FIG. 4) of the base electrode 32 is illustrated, and the base-electrode main portions 32A are disposed at the respective mutually opposite sides of the emitter mesa layer 25. The emitter electrode 33 is disposed on the emitter mesa layer 25.

An insulating film 61 is disposed in such a manner as to cover the collector electrodes 31, the base electrode 32, and the emitter electrode 33. On the insulating film 61, the emitter wiring line E1 and the collector wiring lines C1 are disposed. The emitter wiring line E1 is connected to the emitter electrode 33 passing through the emitter aperture 37 provided in the insulating film 61. The collector wiring lines C1 are respectively connected to the collector electrodes 31 passing through the collector apertures 35 provided in the insulating film 61. As described above, layers including conductor patterns such as the emitter wiring line E1 and the collector wiring lines C1 are disposed above the collector electrodes 31, the base electrode 32, and the emitter electrode 33 with the insulating film 61 interposed therebetween. As illustrated in FIG. 5, the emitter wiring line E1 is disposed in a layer higher than the emitter electrode 33. The base wiring line B1 (FIG. 4) is disposed in a layer higher than the base electrode 32 but not illustrated in the cross section illustrated in FIG. 5. As described above, "a higher layer" is not defined not based on the distance from the main surface of the substrate 60 but based on a height relationship of a plurality of conductor pattern layers stacked in a thickness direction through an insulating film.

Figure 6:
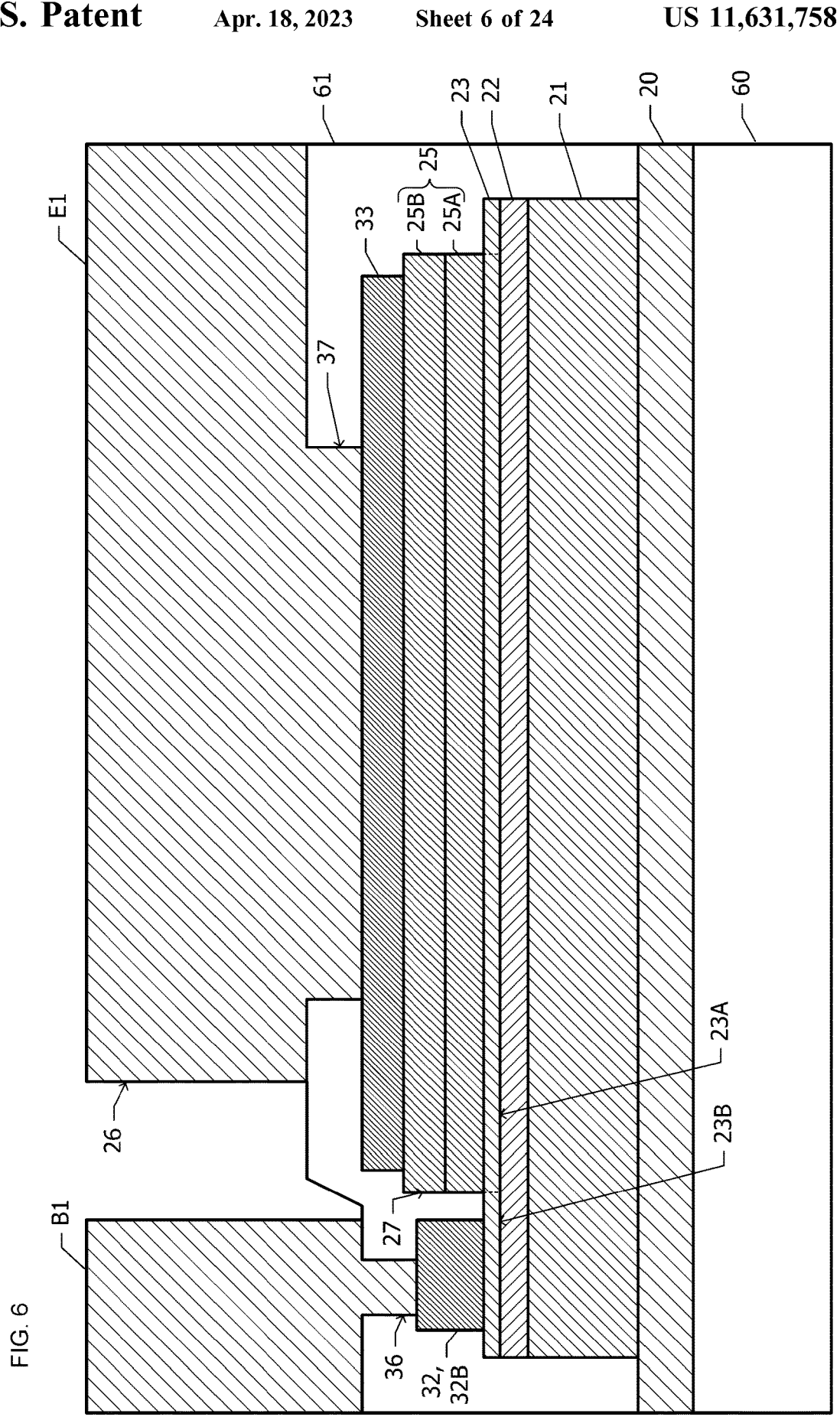
FIG. 6 is a cross-sectional view taken along the alternate long and short dash line 6-6 in FIG. 4.

FIG. 6 is a cross-sectional view taken along the alternate long and short dash line 6-6 in FIG. 4. Hereinafter, the components illustrated in the cross-sectional view of FIG. 5 are not described.

The cross section illustrated in FIG. 6 illustrates the base-electrode pad portion 32B of the base electrode 32. The base wiring line B1 and the emitter wiring line E1 are disposed on the insulating film 61 covering the base electrode 32 and the emitter electrode 33. The base wiring line B1 is connected to the base-electrode pad portion 32B, passing through the base aperture 36 provided in the insulating film 61. The layer of the base wiring line B1 and the layer of the emitter wiring line E1 are flush with each other. A gap between the base wiring line B1 and the emitter wiring line E1 is designed to be the minimum gap, for example, in a design rule for the layer of the base wiring line B1 and the layer of the emitter wiring line E1. The minimum gap in the design rule is set within a range, for example, from about 1.5 μm to about 3 μm inclusive.

With respect to the base-electrode pad portion 32B, an edge 26 located closer to an end portion of the emitter wiring line E1 is located farther than an edge 27 located closer to an end portion of the emitter mesa layer 25 is. The end portion of the emitter wiring line E1 is closer to the base-electrode pad portion 32B than the other end portion thereof is. The end portion of the emitter mesa layer 25 is closer to the base-electrode pad portion 32B than the other end portion thereof is. The arrangement like this minimizes the area of base-collector junction as much as possible under the condition in which the area of the emitter mesa layer 25 is kept constant, and thereby the performance of transistors is improved.

Figure 7:
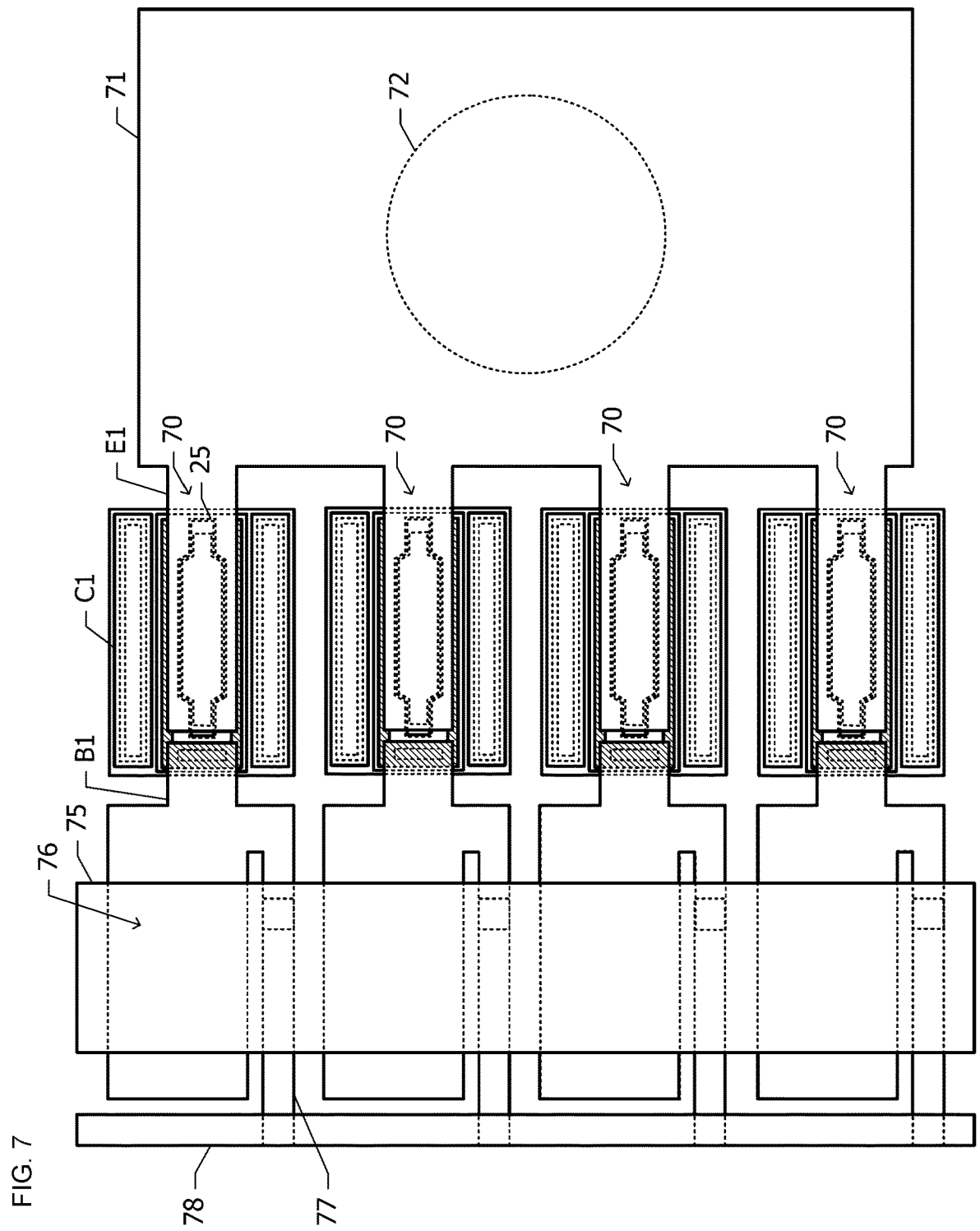
FIG. 7 is a plan view of the semiconductor device according to the first embodiment.

FIG. 7 is a plan view of the semiconductor device according to the first embodiment. The semiconductor device according to the first embodiment includes the plurality of unit transistors 70 (FIG. 4). The plurality of unit transistors 70 are arranged one by one in a direction (vertically in FIG. 7) orthogonal to the longitudinal direction of the emitter mesa layer 25 (first direction).

From each unit transistor 70, the emitter wiring line E1 is extracted toward one side in the first direction (rightward in FIG. 7). The emitter wiring line E1 extracted from the unit transistor 70 is continuous to an emitter common wiring line (ground wiring line) 71. In the plan view, a via hole 72 is provided in the emitter common wiring line 71. The via hole 72 penetrates the substrate 60 (FIGS. 5 and 6) and reaches the back surface of the substrate 60. The emitter common wiring line 71 is connected to a ground electrode for external connection that is provided on the back surface of the substrate 60 by using a metal material disposed in the via hole 72.

From each unit transistor 70, the base wiring line B1 is extracted in a direction (leftwards in FIG. 7) opposite to the direction in which the emitter wiring line E1 is extracted. Each base wiring line B1 has an increased width and overlaps a radio-frequency input wiring line 75. The portion where the base wiring line B1 overlaps the radio-frequency input wiring line 75 functions as a capacitor 76 in the metal-insulator-metal (MIM) structure. Further, the base wiring line B1 is connected to a bias wiring line 78 with a thin-film resistor 77 interposed therebetween.

Each collector wiring line C1 as the first layer in the corresponding unit transistor 70 is connected to a collector common wiring line (not illustrated) disposed as the second layer higher than the emitter common wiring line 71. The emitter common wiring line 71 and the collector common wiring line may each be connected independently to a Cu pillar bump, a solder bump, or the like.

The excellent effects of the first embodiment will be described with reference to FIG. 8.

Figure 8:
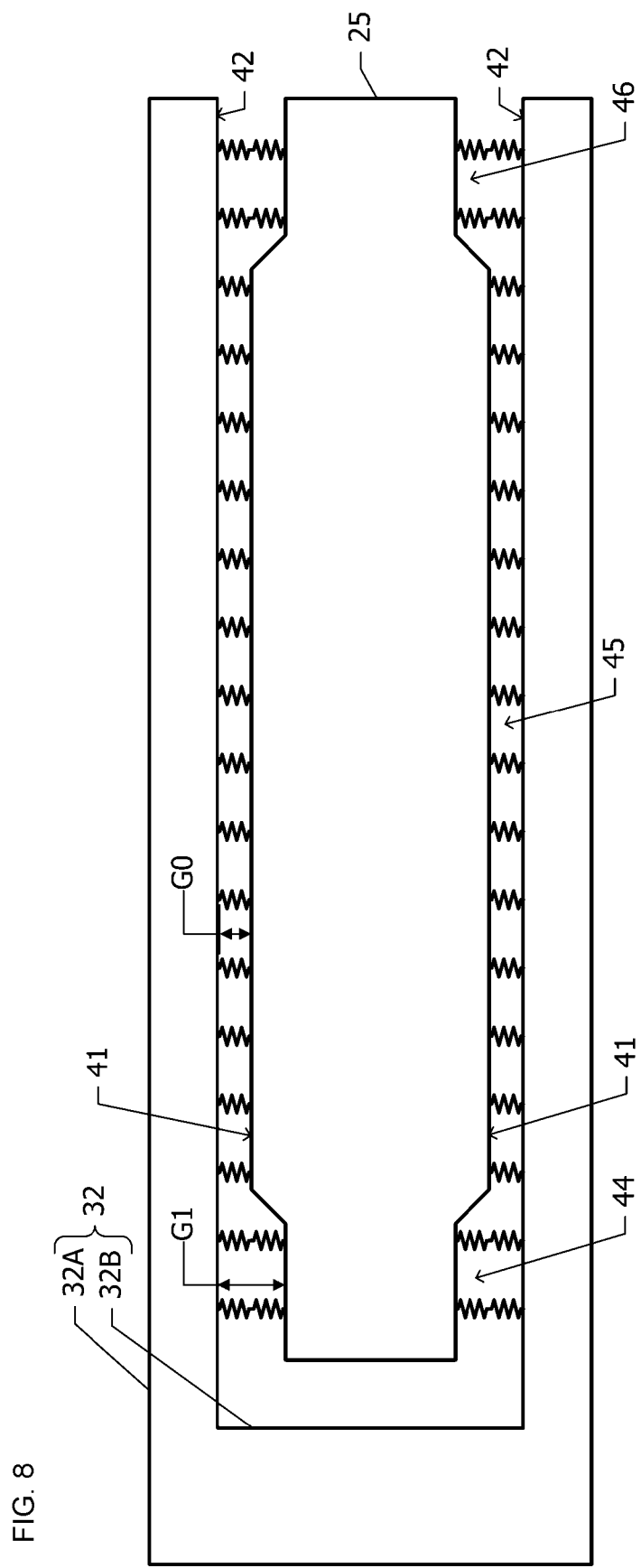
FIG. 8 is a view illustrating a planar positional relationship between an emitter mesa layer and a base electrode of the semiconductor device according to the first embodiment.

FIG. 8 is a view illustrating a planar positional relationship between the emitter mesa layer 25 and the base electrode 32 of the semiconductor device according to the first embodiment. The first edge 41 of the emitter mesa layer 25 and the second edge 42 of the base electrode 32 face each other.

In each of the terminal portions 44 and 46 of the emitter mesa layer 25, the gap G1 between the first edge 41 and the second edge 42 is wider than the gap G0 in the intermediate portion 45. Accordingly, base access resistance is increased in the terminal portions 44 and 46. Specifically, focused on the base access resistance per unit length in the base access resistance in the first direction, the base access resistance in the terminal portions 44 and 46 is higher than the base access resistance in the intermediate portion 45.

When total emitter current Ie and total collector current Ic reaches a point near the snapback point SB involved with an increase of the base current Ib (FIG. 3), the degree of a voltage drop in the terminal portions 44 and 46 becomes larger than that of the voltage drop in the intermediate portion 45 due to relatively high base access resistance. Accordingly, in the terminal portions 44 and 46, a net base potential without the influence of the parasite resistance, that is, a base potential applied to the first edge 41 of the intrinsic emitter layer 23A (FIGS. 4, 5, and 6) is lower than a net base potential applied to the intermediate portion 45. The net base-emitter voltage without the influence of the parasite resistance is thereby relatively lowered in the terminal portions 44 and 46, and as the result, the emitter current Ie and the collector current Ic are relatively reduced. Accordingly, in the terminal portions 44 and 46, the density of current flowing along the emitter-base junction surface is reduced more than in the intermediate portion 45. The relative decrease in the current density causes temperature to be lowered relatively.

The lowered temperature further causes a relatively low current density. This positive feedback chain causes the current density in the terminal portions 44 and 46 to start rapidly lower in a high-current range near the snapback point SB (FIG. 3) in comparison with a low-current range far from the snapback point SB (FIG. 3). In the high-current range exceeding the snapback point SB, the current is finally stopped from flowing substantially. That is, the region where the total emitter current Ie mainly flows and a high temperature region are chiefly limited to the intermediate portion 45 in the first direction. As the result, the operation of the HBT in the high-current region is less likely to be influenced by thermal and electrical asymmetry near both the ends of the emitter mesa layer 25. This prevents occurrence of the kink K (FIG. 3), and the transition voltage rises. The transition voltage rise causes the SOA to be enlarged and enables the HBT to operate at a high voltage.

The preferable dimensions of each component of the semiconductor device according to the first embodiment will be described.

The length of the emitter mesa layer 25 is preferably from about 5 μm to about 80 μm inclusive in the longitudinal direction (first direction). The width of the intermediate portion 45 of the emitter mesa layer 25 is preferably from about 1 μm to about 8 μm inclusive. A difference between the gap G1 and the gap G0 is preferably from about 0.3 μm to about 1 μm inclusive. Setting these dimensions in the above-mentioned ranges leads to not only the enlargement of the SOA but also enhancement of an effect of maintaining the emitter current. The dimension in the first direction of the terminal portions 44 and 46 is preferably longer than or equal to about 0.5 μm and more preferably longer than or equal to about 1 μm. In addition, in consideration of design allowance, the dimension in the first direction of the terminal portions 44 and 46 is preferably longer than or equal to about 2 μm.

The current amplification factor β of the HBT is in a range from about 50 to about 200 inclusive. The sheet resistance ρs of the base layer 22 (FIGS. 5 and 6), the difference between the gaps G1 and G0, and the current amplification factor are preferably set to satisfy $\rho s(G1-G0)/\beta \geq 0.75\ \Omega\cdot\mu m$. For example, when $\rho s=200\ \Omega/sq.$ and $\beta=80$ hold true, the current amplification factor is desirably set to $G1-G0\geq 0.3$ μm.

A modification of the first embodiment will be described. In the first embodiment, the gaps G1 between the first edge 41 and the second edge 42 in the terminal portions 44 and 46 at the respective mutually opposite ends of the emitter mesa layer 25 are set equal to each other and wider than the gap G0 between the first edge 41 and the second edge 42 in the intermediate portion 45. In the modification, the gap G1 in the one terminal portion 44 and the gap G1 in the other terminal portion 46 may be made different from each other. In particular, in the terminal portion 44 closer to the base-electrode pad portion 32B, the HBT operation is likely to be influenced by the thermal or electrical asymmetry. To reduce the influence of the asymmetry, the gap G1 between the first edge 41 and the second edge 42 is preferably set wider in the terminal portion 44 closer to the base-electrode pad portion 32B than the gap G1 in the terminal portion 46.

Figure 9A:
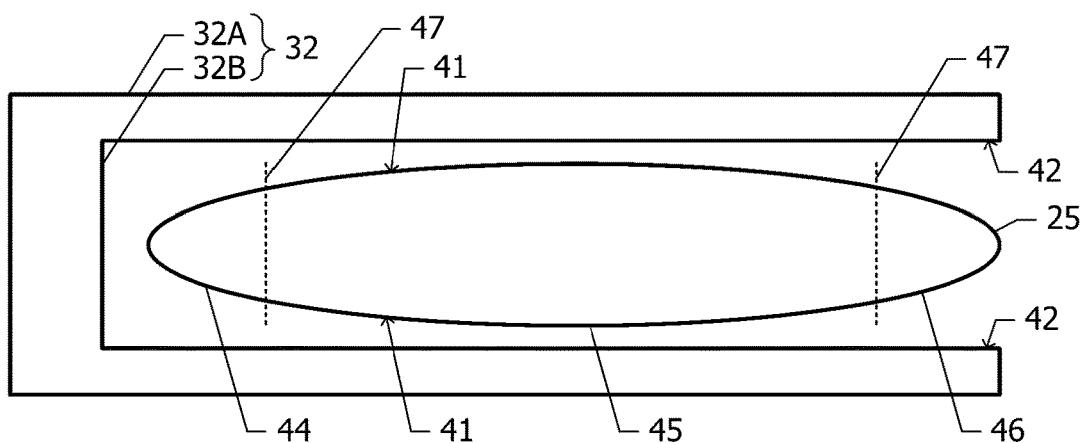
FIGS. 9A, 9B, and 9C are views each illustrating the shapes of and the positional relationship in a plan view between an emitter mesa layer and a base electrode of a semiconductor device according to a modification of the first embodiment.
Figure 9B:
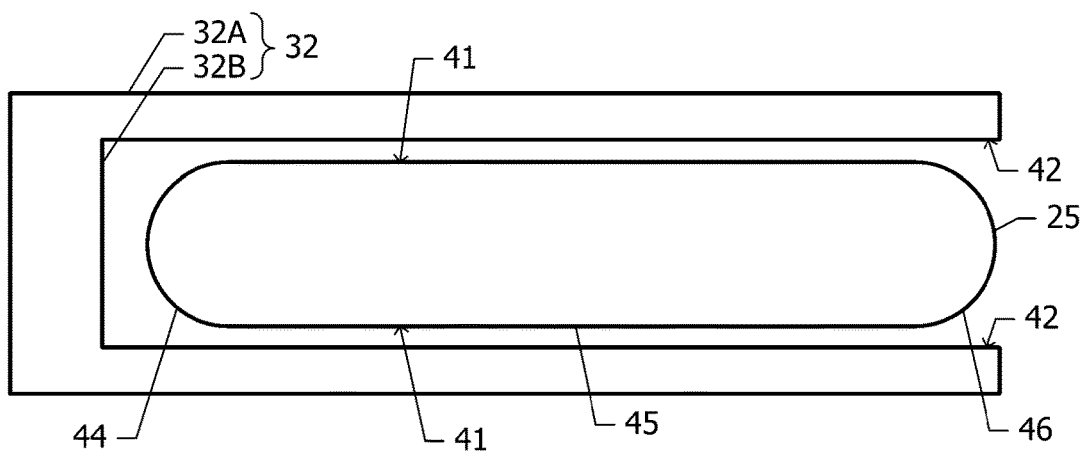
Figure 9C:
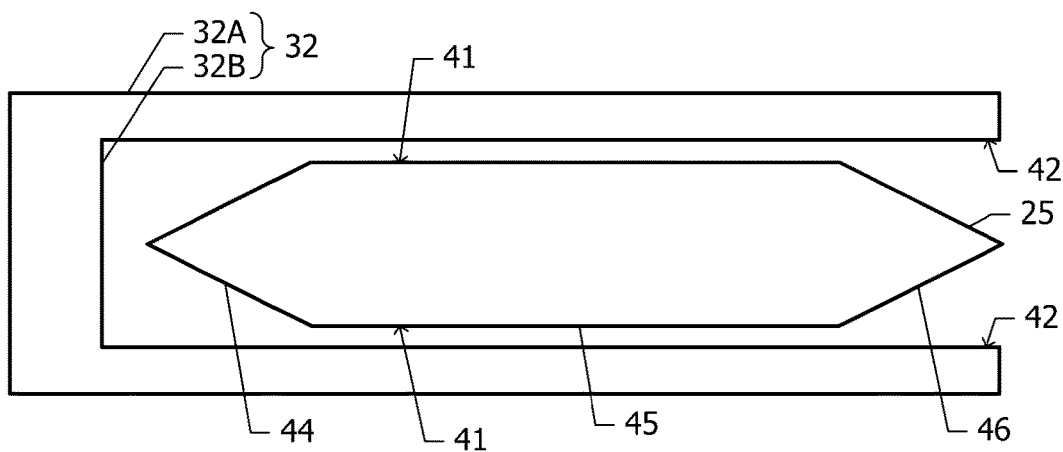

A plurality of other modifications of the first embodiment will be described with reference to FIGS. 9A, 9B, and 9C. FIGS. 9A, 9B, and 9C are views each illustrating the shapes of and the positional relationship in the plan view between the emitter mesa layer 25 and the base electrode 32 of a semiconductor device according to a corresponding one of the modifications of the first embodiment.

In the modification illustrated in FIG. 9A, the emitter mesa layer 25 has a substantially elliptical shape in the plan view. The major axis of the substantially ellipse extends in the longitudinal direction (first direction) of the base-electrode main portions 32A. Two outer edges obtained by dividing the emitter mesa layer 25 into two with respect to the major axis of the ellipse can each be considered to the first edge 41 extending in the first direction.

In this modification, it is not possible to define a boundary 47 between each of the terminal portions 44 and 46 and the intermediate portion 45 based on the shape of the emitter mesa layer 25. No matter where the boundary 47 between each of the terminal portions 44 and 46 and the intermediate portion 45 is defined, the first edge 41 in each of the terminal portions 44 and 46 is disposed at a position receded farther than the position of the first edge 41 in the intermediate portion 45 in the direction away from the second edge 42. In this point, this modification is the same as the case of the first embodiment. In this modification, gaps between the second edge 42 and the first edge 41 in a second direction orthogonal to the first direction are not constant; however, it can be said that when the gaps are averaged in the first direction, the gap between the first edge 41 in each of the terminal portions 44 and 46 and the second edge 42 is wider than the gap between the first edge 41 in the intermediate portion 45 and the second edge 42.

In the modification illustrated in FIG. 9B, the emitter mesa layer 25 has a substantially racetrack shape in the plan view, specifically, a shape in which substantially semicircles are connected to two respective short sides of a substantially rectangle extending in the first direction. In this case, the substantially rectangular portion may be defined as the intermediate portion 45, and the substantially semicircular portions may be defined as the terminal portions 44 and 46, respectively. Two outer edges obtained by dividing the substantially racetrack shape into two with respect to a straight line connecting the center of each of the two substantially semicircles can each be considered as the first edge 41 extending in the first direction.

This modification is also the same as the case of the first embodiment in that each first edge 41 in the terminal portion 44 is disposed at a position receded farther than the position of the first edge 41 in the intermediate portion 45 in the direction away from the corresponding second edge 42. Further, it can be said that the gap between the first edge 41 in each of the terminal portions 44 and 46 and the second edge 42 is wider than the gap between the first edge 41 in the intermediate portion 45 and the second edge 42.

In the modification illustrated in FIG. 9C, the emitter mesa layer 25 has a substantially hexagonal shape in the plan view, more specifically, a shape in which the base of a substantially isosceles triangle is connected to each of the two short sides of a substantially rectangle extending in the first direction. In this case, the substantially rectangular portion may be defined as the intermediate portion 45, and the substantially isosceles triangle portions may be defined as the terminal portions 44 and 46. Two outer edges obtained by dividing the substantially hexagonal into two with respect to the vertex angles of the two isosceles triangle can each be considered as the first edge 41 extending in the first direction.

This modification is also the same as the case of the first embodiment in that each first edge 41 in the terminal portion 44 is disposed at a position receded farther than the position of the first edge 41 in the intermediate portion 45 in the direction away from the corresponding second edge 42. Further, it can be said that the gap between the first edge 41 in each of the terminal portions 44 and 46 and the second edge 42 is wider than the gap between the first edge 41 in the intermediate portion 45 and the second edge 42.

Accordingly, like the first embodiment, the modification of the first embodiment illustrated in FIGS. 9A, 9B, and 9C also exert excellent effects in which the SOA is enlarged and the high-voltage operation of the HBT is enabled.

Still another modification of the first embodiment will be described with reference to FIG. 10.

Figure 10:
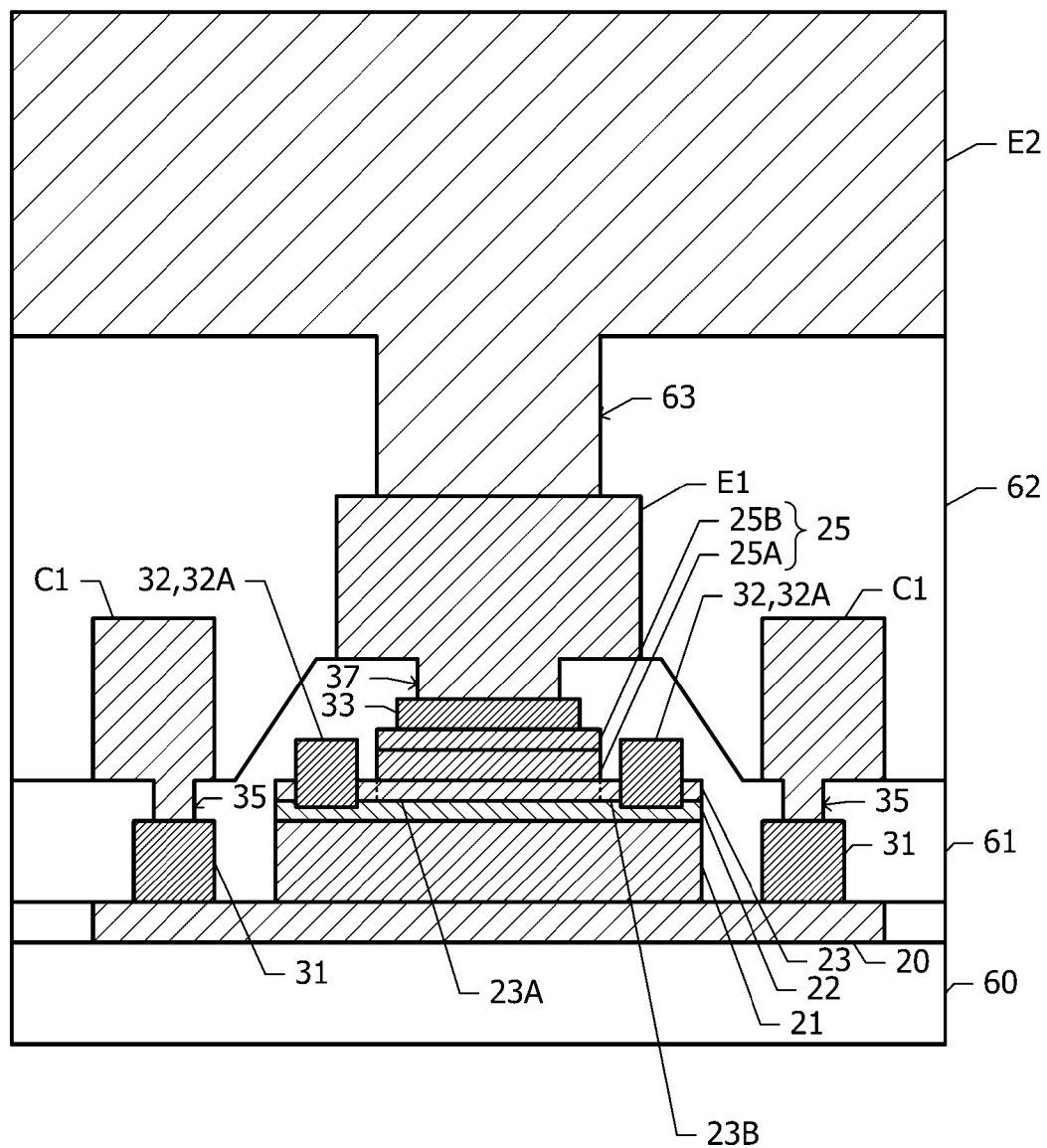
FIG. 10 is a cross-sectional view of a semiconductor device according to a modification of the first embodiment.

FIG. 10 is a cross-sectional view of a semiconductor device according to this modification. The configuration of the components including the collector wiring lines C1 and the emitter wiring line E1 that are located on the substrate 60 side is the same as the configuration of the semiconductor device (FIG. 5) according to the first embodiment.

In the first embodiment, the layer of the emitter common wiring line 71 (FIG. 7) connecting the emitter electrodes 33 of the respective unit transistors 70 is flush with the layer of the emitter wiring line E1. In addition, in the plan view, the emitter common wiring line 71 is located not to overlap the unit transistors 70. In contrast in this modification, an emitter wiring line E2 as a second layer is disposed instead of the emitter common wiring line 71. The emitter wiring line E2 is disposed on the emitter wiring line E1 and an insulating film 62 covering the collector wiring lines C1. The emitter wiring line E2 as the second layer is connected to the emitter wiring line E1 as the first layer, passing through an emitter aperture 63 provided in the insulating film 62. In the plan view, the emitter wiring line E2 as the second layer overlaps the plurality of unit transistors 70.

A Cu pillar bump, a solder bump, or the like for face-down mounting is disposed on the emitter wiring line E2 as the second layer. In this modification, the Cu pillar bump, the solder bump, or the like may be located close to the emitter mesa layer 25 serving as a heat generation source. This structure contributes to reduction of thermal resistance in a heat dissipation path. In this arrangement, the collector wiring line is extended in FIG. 7 on a side (rightwards in FIG. 7) opposite to the side on which the base wiring line B1 is extended from the collector electrodes 31 (FIGS. 4 and 5) and connected to the collector common wiring line that is a wiring line as the first layer. On this collector common wiring line, a Cu pillar bump, a solder bump, or the like for collector is disposed.

Still another modification of the first embodiment will be described. In the first embodiment, the emitter electrode 33 is disposed inward of the emitter mesa layer 25 in the plan view; however, a configuration in which the emitter electrode 33 projects to the outer side portion of the emitter mesa layer 25 may be used. This can be configured by using a self-alignment process in which, for example, the emitter electrode 33 is used as an etching mask to etch the semiconductor layer under the emitter electrode 33 and thereby to leave the emitter mesa layer 25.

Second Embodiment

A semiconductor device according to a second embodiment will be described with reference to FIGS. 11, 12, and 13. Hereinafter, the configuration common to the configuration of the semiconductor device according to the first embodiment (FIGS. 4 to 8) is not described.

Figure 11:
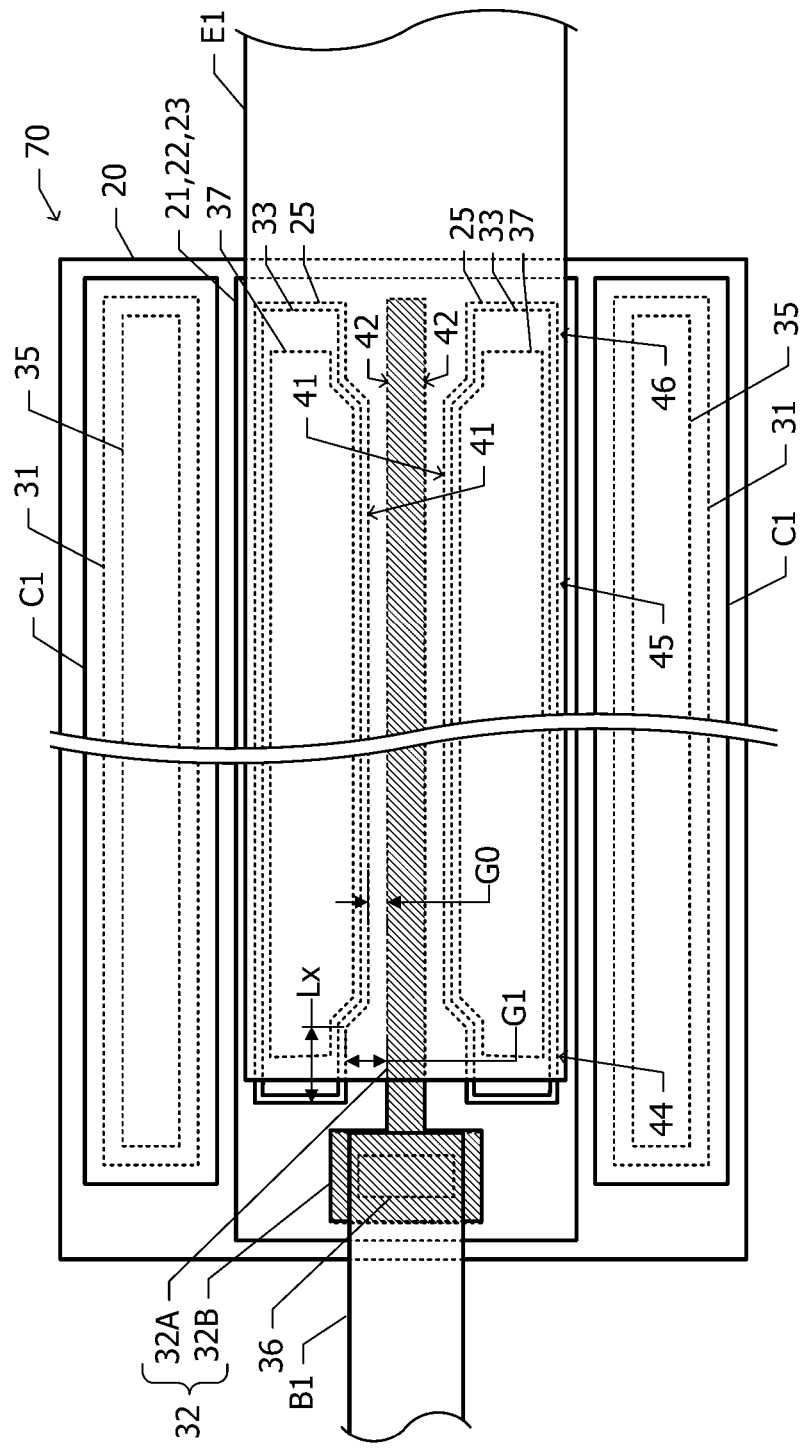
FIG. 11 is a plan view of one of a plurality of unit transistors included in a semiconductor device according to a second embodiment.

FIG. 11 is a plan view of one of a plurality of unit transistors 70 included in the semiconductor device according to the second embodiment. In the first embodiment, the one emitter mesa layer 25 is surrounded in the substantially U-letter shape by the base electrode 32. In contrast, the unit transistor 70 of the semiconductor device according to the second embodiment has a double-emitter structure in which the emitter mesa layer 25 is composed of two components in the plan view. The two components of the emitter mesa layer 25 each have a planar shape extending in the first direction and are arranged so as to be spaced away from each other in the second direction orthogonal to the first direction.

The base electrode 32 includes one base-electrode main portion 32A and the base-electrode pad portion 32B continuous to the base-electrode main portion 32A. The base-electrode main portion 32A is disposed between the two components of the emitter mesa layer 25. The first edge 41 forming part of the edges of the two components of the emitter mesa layer 25 faces the base-electrode main portion 32A. The second edges 42 forming part of the edges of the base-electrode main portion 32A face the two components of the emitter mesa layer 25. The edges on the respective mutually opposite sides of the base-electrode main portion 32A in the width direction correspond to the second edges 42.

Also in the second embodiment, the gap between each first edge 41 and each second edge 42 exhibits the same change in the first direction as the change in the gap between the first edge 41 and the second edge 42 in the first embodiment. That is, in the terminal portions 44 and 46 of the emitter mesa layer 25, the gap G1 between the first edge 41 and the second edge 42 is wider than the gap G0 in the intermediate portion 45.

The excellent effects of the second embodiment will be described.

Also in the second embodiment, the gap between the first edge 41 and the second edge 42 changes in the same manner as in the first embodiment, the excellent effects in which the transition voltage is raised and the SOA is enlarged are obtained. Further, in the second embodiment, in the proportion of the area of the collector layer 21 to the area of the emitter mesa layer 25 is lower than that in the first embodiment. As the result, an excellent effect in which the radio-frequency characteristics (such as gain and efficiency) of the HBT are improved is obtained.

Evaluation experiments performed to verify the excellent effects of the second embodiment will be described.

In the evaluation experiments, the collector current-collector voltage characteristic of each of the semiconductor device according to the second embodiment and the semiconductor device according to the comparative example is measured, and the SOA line is obtained. In the configuration of the semiconductor device according to the comparative example, the gap G1 in the semiconductor device according to the second embodiment illustrated in FIG. 11 is equal to the gap G0. The length (dimension in the first direction) of the emitter mesa layer 25 is about 40 μm, the width (dimension in the direction orthogonal to the first direction) is about 3 μm, and the gaps G0 and G1 are each about 1 μm.

In the semiconductor device according to the second embodiment, the gap G1 is about 2 μm, and the gap G0 is about 1 μm. The length of the emitter mesa layer 25 is about 40 μm, and the width of the intermediate portion 45 of the emitter mesa layer 25 is about 3 μm. A plurality of samples are manufactured. In the samples, the terminal portions 44 and 46 each have a relatively wide gap between the first edge 41 and the second edge 42, and the dimensions in the first direction of each of the terminal portions 44 and 46 are made different in a range from about 1.5 μm to about 7.5 μm inclusive.

Figure 12:
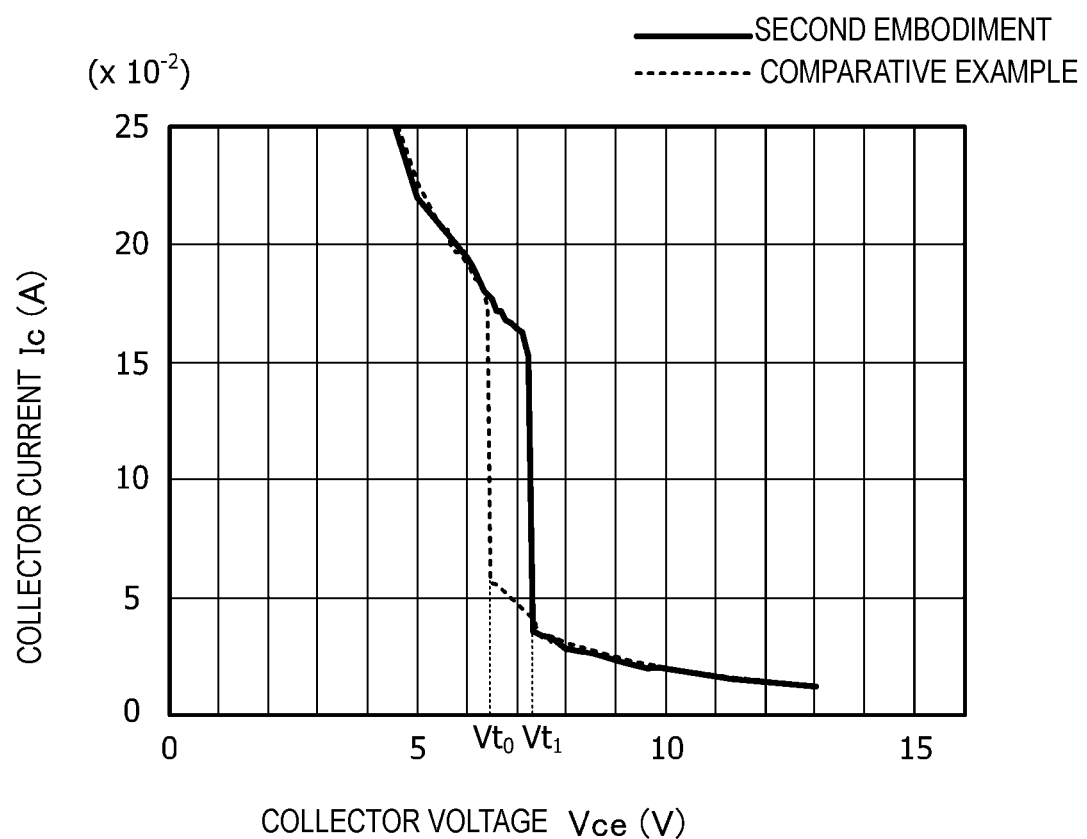
FIG. 12 is a graph representing the results of actual measurements of the SOA line of the semiconductor device according to the second embodiment.

FIG. 12 is a graph representing the results of actual measurements of the SOA line of the semiconductor device according to the second embodiment. The horizontal axis represents collector voltage Vce by using the unit "V", and the vertical axis represents collector current Ic by using the unit "A". The solid line and the broken line in the graph in FIG. 12 respectively represent the SOA lines of the semiconductor devices according to the second embodiment and the comparative example, respectively. Note that in the semiconductor device according to the second embodiment having the characteristics illustrated in FIG. 12, the dimension in the first direction of each of the terminal portions 44 and 46 each having a relatively wide gap between the first edge 41 and the second edge 42 is about 1.5 µm.

It is verified that the use of the configuration of the semiconductor device according to the second embodiment causes the transition voltage to rise from $V_{t0}$ to $V_{t1}$ compared with the configuration in the comparative example and results in an enlarged SOA.

Figure 13:
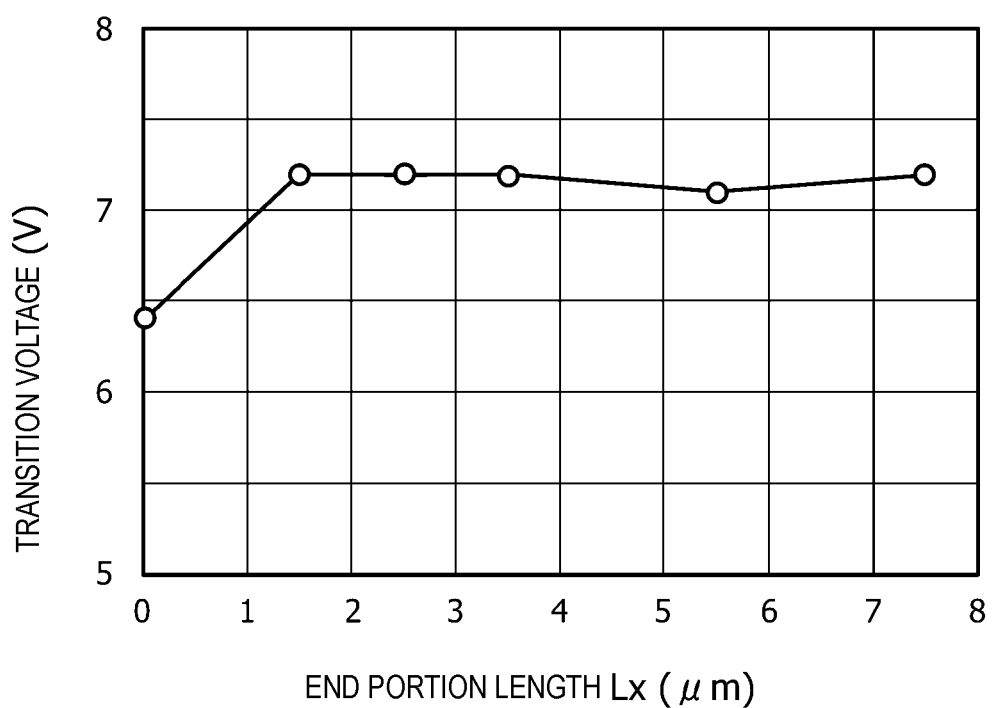
FIG. 13 is a graph representing a relationship between a transition voltage and a dimension, in a first direction, of a terminal portion at each end of an emitter mesa layer.

FIG. 13 is a graph representing a relationship between the transition voltage and the dimension in the first direction of the terminal portions 44 and 46 at the respective ends of the emitter mesa layer 25. The horizontal axis represents a first-direction dimension Lx of the terminal portions 44 and 46 by using the unit "µm", and the vertical axis represents transition voltage by using the unit "V". A sample having the first-direction dimension Lx of 0 in the corresponding terminal portion 44 or 46 corresponds to the semiconductor device according to the comparative example.

It is verified that if the first-direction dimension Lx of the terminal portions 44 and 46 is at least in a range from about 1.5 µm to about 7.5 µm inclusive, an effect of raising the transition voltage is obviously obtained.

The preferable dimension of the terminal portions 44 and 46 will be described.

It is verified from actual measurement results illustrated in FIGS. 12 and 13 that if the dimension in the first direction (length) of the terminal portions 44 and 46 is set longer than or equal to about 1.5 µm, the effect of SOA enlargement is obtained. Note that even though the length of the terminal portions 44 and 46 is shorter than about 1.5 µm, the SOA enlargement effect is obtained to some extent. Note that if the terminal portions 44 and 46 are made excessively short, it is not possible to discriminate the terminal portions 44 and 46 from the intermediate portion 45 due to restriction in the fine processing accuracy in a semiconductor process. To discriminate the terminal portions 44 and 46 from the intermediate portion 45 and to obtain the SOA enlargement effect, the terminal portions 44 and 46 are preferably made longer than or equal to about 0.5 µm.

Making the terminal portions 44 and 46 excessively long leads to a large influence of a decrease in the area of the emitter mesa layer 25 and the intrinsic emitter layer 23A. Specifically, at the same base voltage, lower current is obtained. Accordingly, it is preferable that the length of the terminal portions 44 and 46 be set close to the lower limit of the range leading to a sufficient effect of the SOA enlargement.

An excessively small difference between the gaps G1 and G0 leads to a small difference between the base access resistance in the terminal portions 44 and 46 and the base access resistance in the intermediate portion 45. As the result, an event in which the current density of the current flowing through the intrinsic emitter layer 23A relatively decreases in the terminal portions 44 and 46 is less likely to occur in the high-current region. To limit, to the intermediate portion 45 in the high-current region, the region where the emitter current mainly flows, the gap G1 is preferably about 0.3 µm wider than the gap G0.

A preferable relationship between the difference between the gaps G1 and G0 (G1−G0) and the length Lx of the terminal portions 44 and 46 will be described. The characteristics of a transistor is less likely to be influenced by the asymmetry in the width direction (direction orthogonal to the first direction) in the components around the emitter mesa layer 25 and is likely to be influenced by the asymmetry in the longitudinal direction (first direction). This is because the widthwise dimension of the emitter mesa layer 25 is smaller than the lengthwise dimension of the emitter mesa layer 25, and thus the planar area is small. To reduce the influence of the asymmetry in the longitudinal direction that is likely to be influenced by the asymmetry, the length Lx of the terminal portions 44 and 46 is preferably set longer than the difference G1−G0.

A semiconductor device according to a modification of the second embodiment will be described with reference to FIG. 14.

Figure 14:
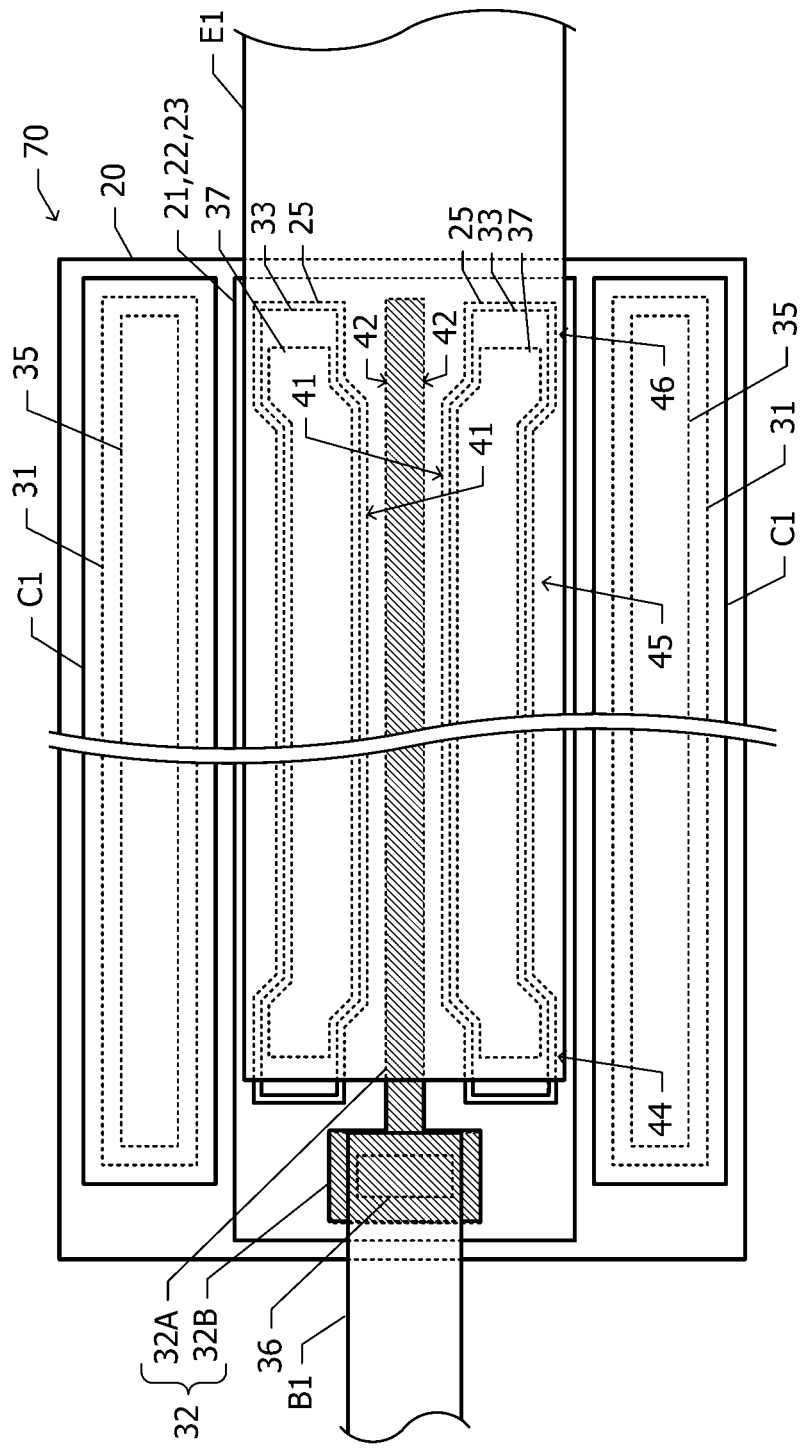
FIG. 14 is a plan view of a semiconductor device according to a modification of the second embodiment.

FIG. 14 is a plan view of a semiconductor device according to a modification of the second embodiment. In the second embodiment, in the plan view, an edge opposite to the first edge 41 of the emitter mesa layer 25 forms a straight line from one end portion to the other end portion. Accordingly, the terminal portions 44 and 46 have a narrower width than the width of the intermediate portion 45. In contrast in this modification, the edge of the emitter mesa layer 25 opposite to the first edge 41 is bent in such a manner that the terminal portions 44 and 46 have almost the same width as the width of the intermediate portion 45.

As described above, the width of the emitter mesa layer 25 may be made almost constant from one end portion to the other end portion. Also in this case, the second edge 42 of the base-electrode main portion 32A and the first edge 41 of the emitter mesa layer 25 have the same positional relationship as that in the second embodiment. This exerts, like the second embodiment, the excellent effects in which the transition voltage is raised and the SOA is enlarged.

Another modification of the second embodiment will be described. In the second embodiment, the emitter electrode 33 is disposed inward of the emitter mesa layer 25 in the plan view; however, the configuration in which the emitter electrode 33 projects to the outer side portion of the emitter mesa layer 25 may be used. This can be configured by using the self-alignment process in which, for example, the emitter electrode 33 is used as an etching mask to etch the semiconductor layer under the emitter electrode 33 and thereby to leave the emitter mesa layer 25.

Third Embodiment

A semiconductor device according to a third embodiment will be described with reference to FIG. 15. Hereinafter, the configuration common to the configuration of the semiconductor device according to the first embodiment (FIGS. 4 to 7) is not described.

Figure 15:
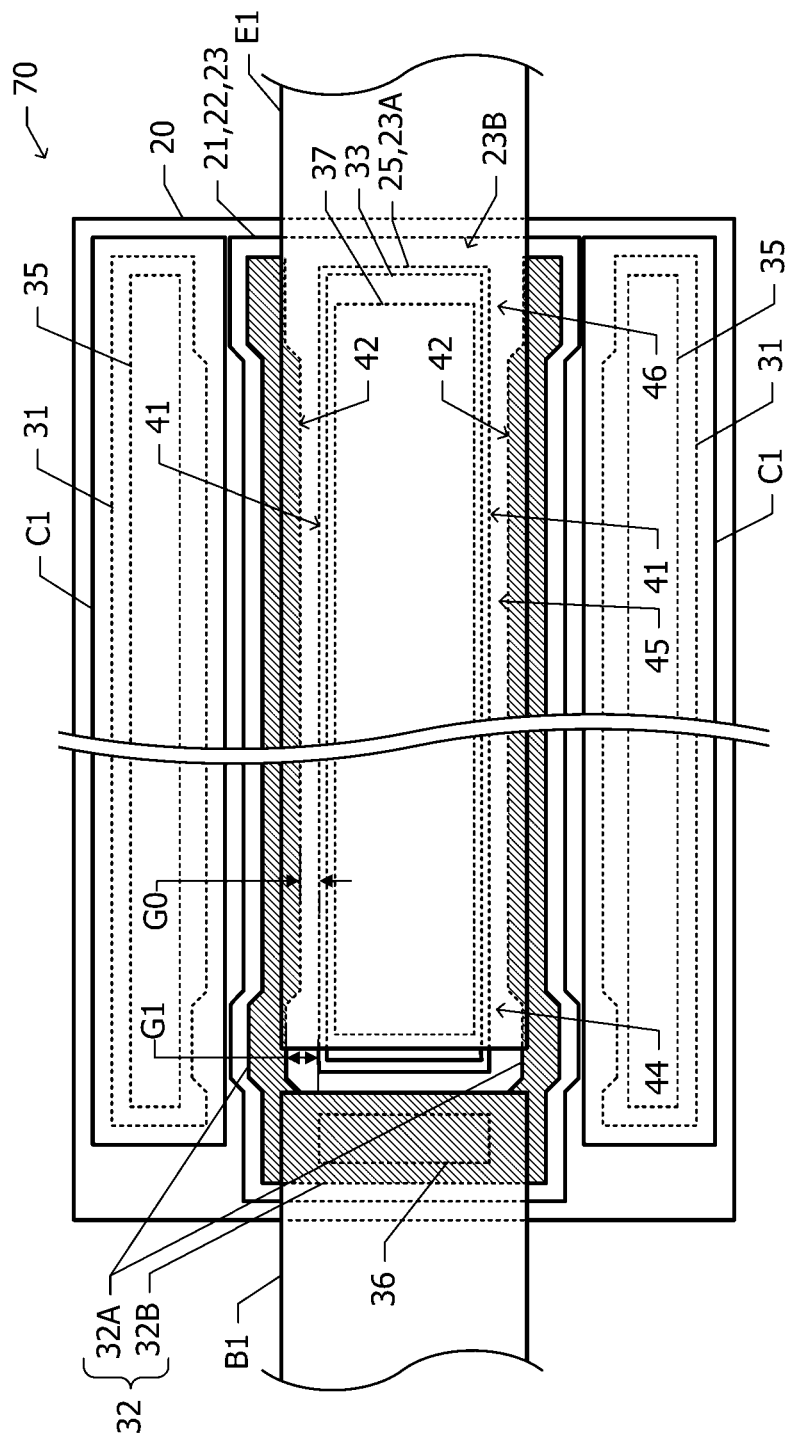
FIG. 15 is a plan view of one of a plurality of unit transistors of a semiconductor device according to a third embodiment.

FIG. 15 is a plan view of one of a plurality of unit transistors 70 included in the semiconductor device according to the third embodiment. In the first embodiment, the second edge 42 of the base-electrode main portion 32A forms one straight line, while the first edge 41 of the emitter mesa layer 25 facing the second edge 42 forms a bent line. Making the first edge 41 form the bent line makes the gap G1 in the terminal portions 44 and 46 wider than the gap G0 in the intermediate portion 45.

In contrast in the third embodiment, the first edge 41 of the emitter mesa layer 25 forms one straight line, while the second edge 42 of the base-electrode main portion 32A forms a bent line. Specifically, the second edge 42 of the base-electrode main portion 32A facing the terminal portions 44 and 46 of the emitter mesa layer 25 is located at a position receded farther than the position of the second edge 42 facing the intermediate portion 45 in the direction away from the first edge 41 of the emitter mesa layer 25.

An edge of the base-electrode main portion 32A opposite to the second edge 42 also forms a bent line following the shape of the second edge 42, and the width of the base-electrode main portion 32A is made almost constant. In the plan view, the shapes of the edges of the collector layer 21 including the base electrode 32 in the inner side portion, the base layer 22, and the emitter layer 23 also follow the shape of the edge of the base-electrode main portion 32A. Specifically, the edges of respective portions of the collector layer 21, the base layer 22, and the emitter layer 23 form the bent lines, the portions following the base-electrode main portion 32A. This configuration makes almost constant the gap between each of the collector layer 21, the base layer 22, and the edge of the emitter layer 23 and the base-electrode main portion 32A. The shape of the edge of each collector electrode 31 facing the collector layer 21 also forms a bent line following the shape of the edge of the collector layer 21.

In an example, a dimension in the first direction (length) of the emitter mesa layer 25 is from about 5 μm to about 80 μm inclusive, and a dimension (width) orthogonal to the first direction is from about 1 μm to about 8 μm inclusive. Like the first embodiment, the difference between the gap G1 and the gap G0 is desirably be from about 0.3 μm to about 1 μm inclusive. A preferable dimension in the first direction of the terminal portions 44 and 46 that are respective portions with a wide gap between the first edge 41 and the second edge 42 is the same as in the first embodiment.

The excellent effects of the third embodiment will be described. Also in the third embodiment, the base access resistance in the terminal portions 44 and 46 of the emitter mesa layer 25 is relatively high. Accordingly, like the first embodiment, it is possible to raise the transition voltage and enlarge the SOA. This enables the HBT to operate at a high-voltage operation.

Further, in the third embodiment, the terminal portions 44 and 46 of the emitter mesa layer 25 are not made narrower than the intermediate portion 45. That is, the regions where the emitter current and the collector current flow are larger than those in the first embodiment. As the result, an effect in which the total collector current Ic can be kept high is obtained.

The edges of the collector layer 21, the base layer 22, and the emitter layer 23 are bent in accordance with the bent shape of the outer edge of each base-electrode main portion 32A, and thus the collector layer 21, the base layer 22, and the emitter layer 23 have a smaller area from a planar shape viewpoint than the area in the case of the straight line. As the result, an increase of base-collector junction capacitance Cbc can be reduced, and the deterioration of the radio-frequency characteristics is reduced.

A semiconductor device according to a modification of the third embodiment will be described with reference to FIG. 16.

Figure 16:
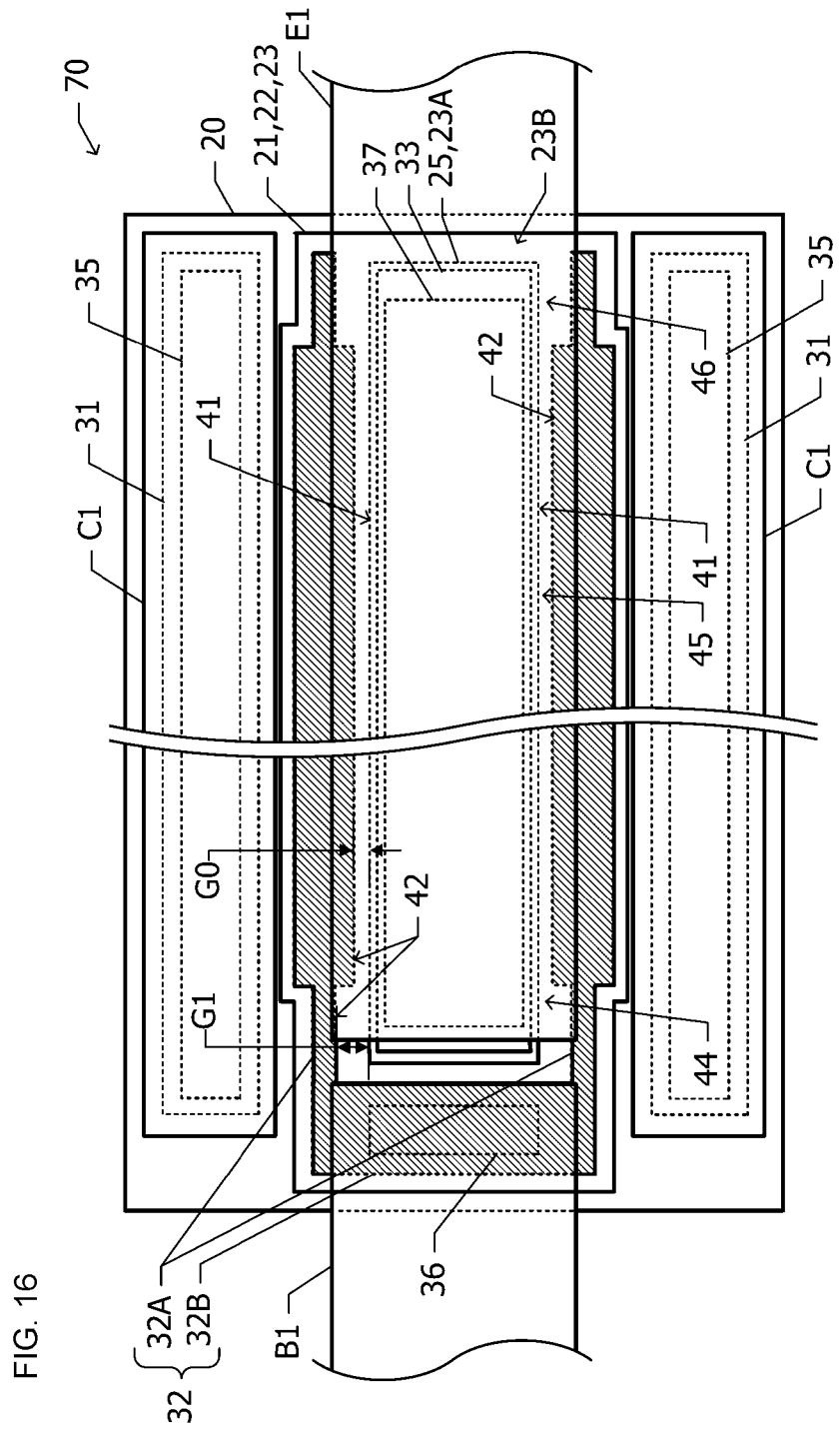
FIG. 16 is a plan view of the semiconductor device according to a modification of the third embodiment.

FIG. 16 is a plan view of the semiconductor device according to this modification. In the third embodiment (FIG. 15), edges of the respective base-electrode main portions 32A opposite to the second edge 42 each form a bent line following the shape of the second edge 42, and the width of each base-electrode main portion 32A is made almost constant. In contrast in this modification, the width of the terminal portion at each end of the base-electrode main portion 32A is narrower than the width of the intermediate portion of the base-electrode main portion 32A. The second edge 42 in the terminal portion of the base-electrode main portion 32A is located at a position receded farther than the position of the second edge 42 in the intermediate portion in the direction away from the first edge 41 of the emitter mesa layer 25. Accordingly, like the third embodiment, the gap G1 in the terminal portions 44 and 46 is wider than the gap G0 in the intermediate portion 45. Accordingly, like the third embodiment, it is possible to raise the transition voltage and enlarge the SOA.

A semiconductor device according to another modification of the third embodiment will be described with reference to FIG. 17.

Figure 17:
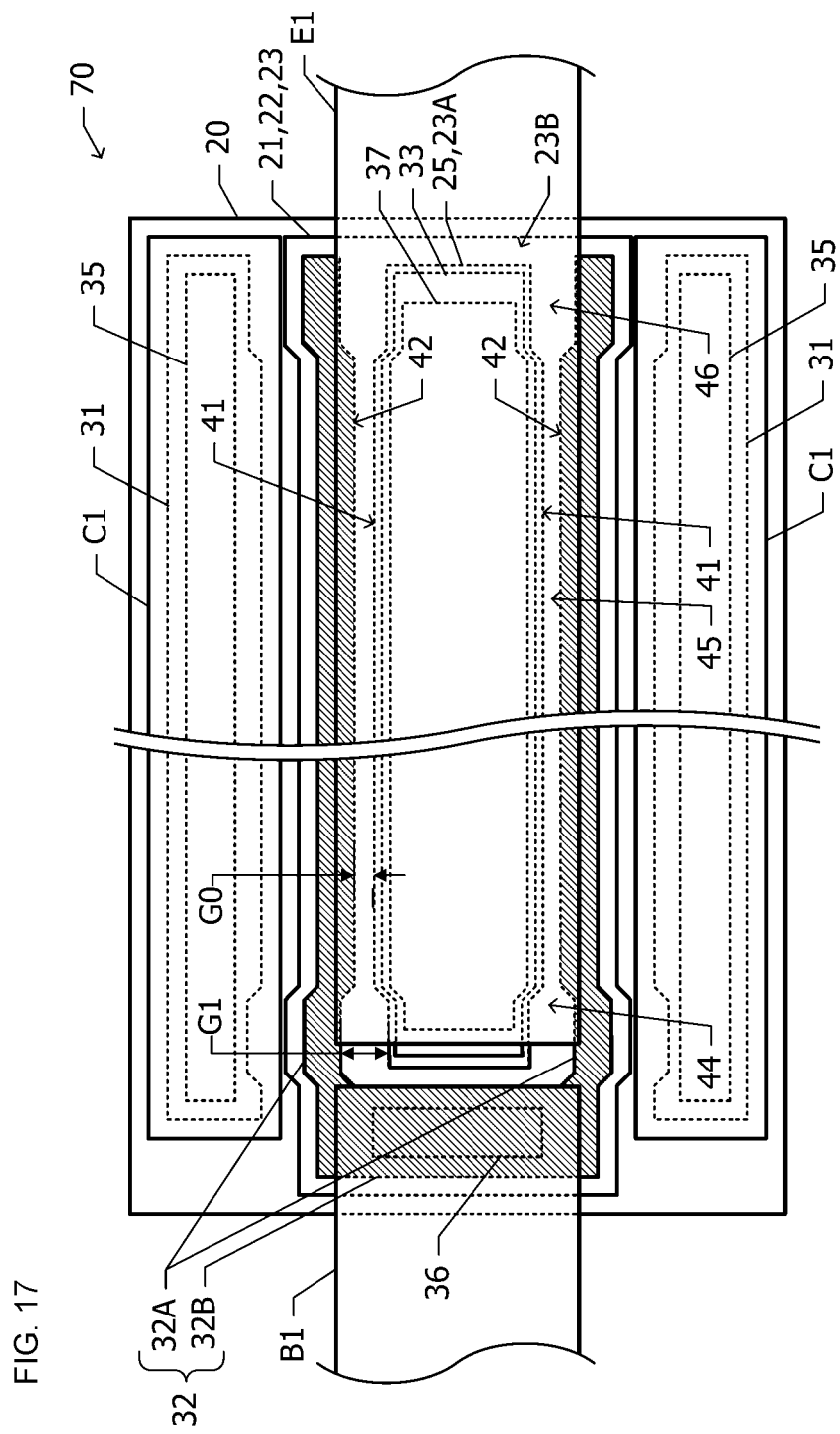
FIG. 17 is a plan view of a semiconductor device according to another modification of the third embodiment.

FIG. 17 is a plan view of the semiconductor device according to this modification. In this modification, not only the second edge 42 of each base-electrode main portion 32A but also the first edge 41 of the emitter mesa layer 25 is bent as in the first embodiment (FIG. 4). The use of this configuration leads to a decrease in the degree of bending of the first edge 41 and the second edge 42 in each of the terminal portions 44 and 46 under the condition in which the difference between the gap G1 and the gap G0 is constant. On the contrary, making the same the degree of bending of the first edge 41 and the second edge 42 in each of the terminal portions 44 and 46 as that in the first embodiment and the second embodiment enables the difference between the gap G1 and the gap G0 to be increased. The term "the degree of bending" denotes an amount of widthwise displacement between the edge of the terminal portions 44 and 46 and the edge of the intermediate portion 45.

A semiconductor device according to still another modification of the third embodiment will be described with reference to FIG. 18.

Figure 18:
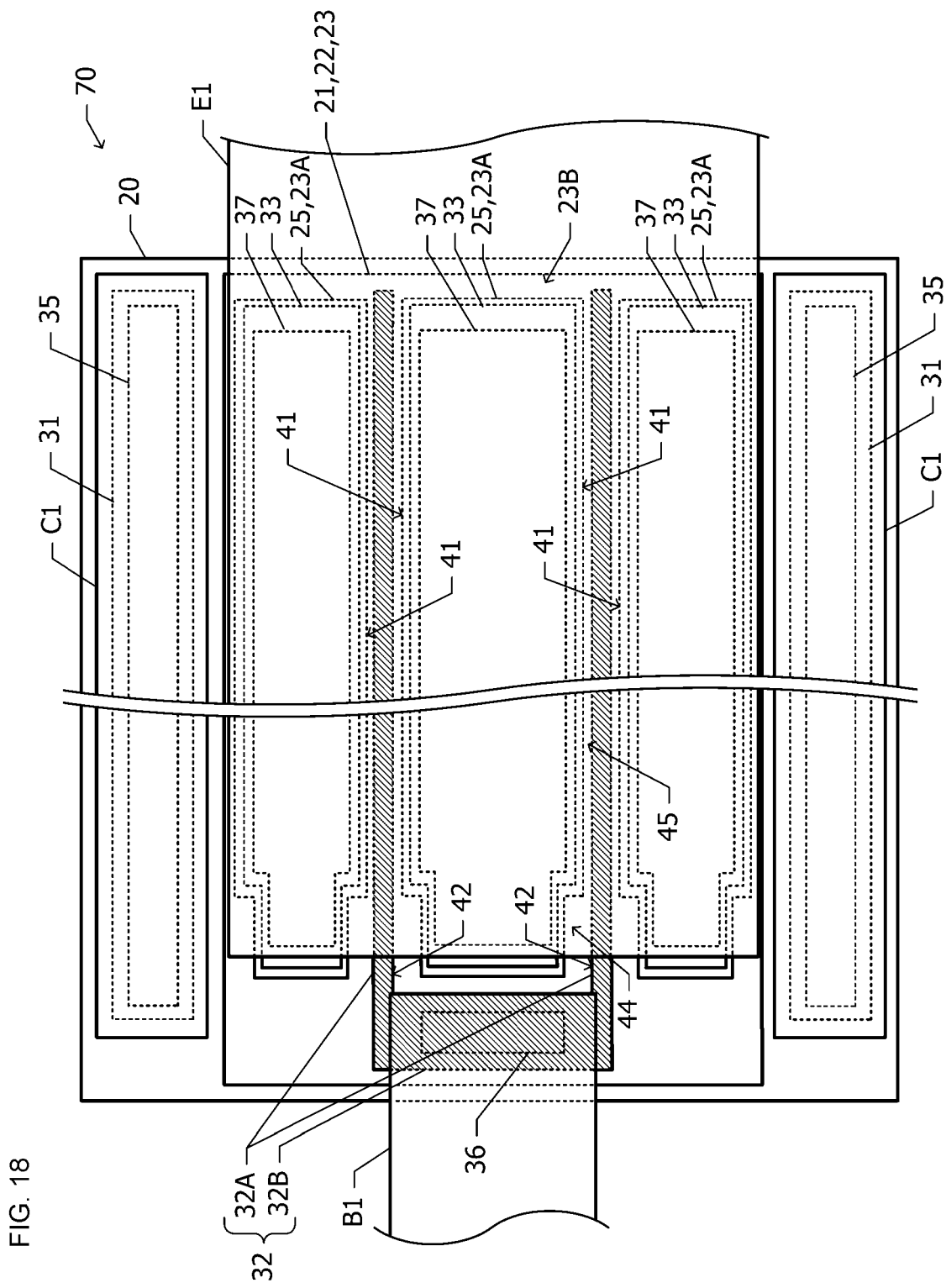
FIG. 18 is a plan view of a semiconductor device according to still another modification of the third embodiment.

FIG. 18 is a plan view of the semiconductor device according to this modification. In the third embodiment (FIG. 15), the base-electrode main portions 32A are disposed at the respective mutually opposite sides of the one emitter mesa layer 25 in the width direction. In this modification, additional two emitter mesa layers 25 are disposed, and thus a total of three emitter mesa layers 25 are disposed. The three emitter mesa layers 25 are arranged one by one in the width direction, and each base-electrode main portion 32A is disposed between the two emitter mesa layers 25 adjacent widthwise to each other.

The first edges 41 of the emitter mesa layer 25 are disposed at the respective mutually opposite sides of each base-electrode main portion 32A in the width direction. In each first edge 41, the first edge 41 in the terminal portion 44 is located at a position receded farther than the position of the first edge 41 in the intermediate portion 45 in the direction away from the corresponding second edge 42 of the base-electrode main portion 32A. Accordingly, also in this modification like the third embodiment, it is possible to raise the transition voltage and enlarge the SOA. Note that the number of emitter mesa layers 25 may be 4 or more. For example, in a case where the four emitter mesa layers 25 are arranged one by one in the width direction, a total of three base-electrode main portions 32A are desirably arranged.

A semiconductor device according to still another modification of the third embodiment will be described with reference to FIG. 19.

Figure 19:
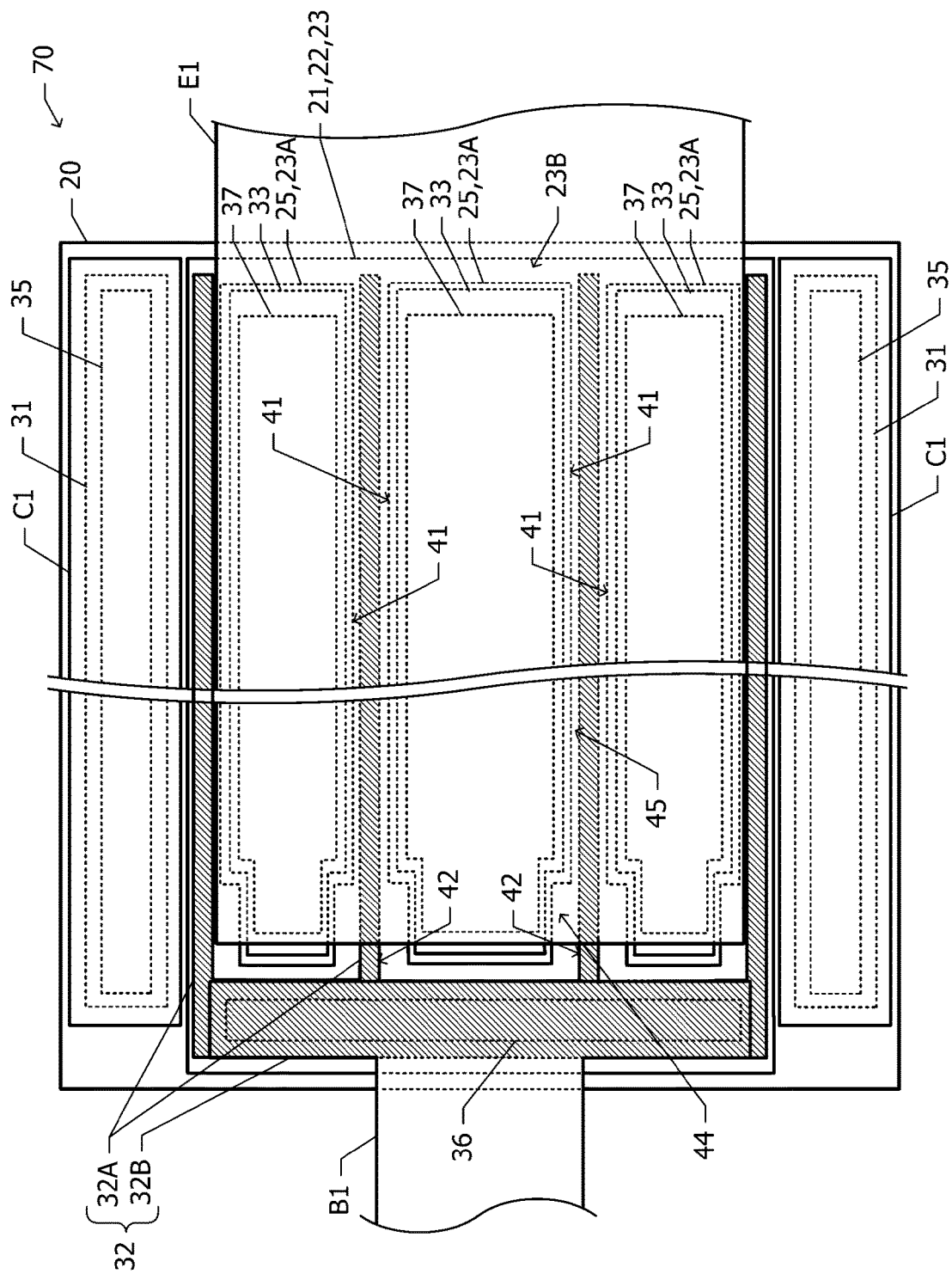
FIG. 19 is a plan view of a semiconductor device according to still another modification of the third embodiment.

FIG. 19 is a plan view of the semiconductor device according to this modification. The semiconductor device according to the modification illustrated in FIG. 19 has the three emitter mesa layers 25 like the semiconductor device according to the modification illustrated in FIG. 18. In the modification illustrated in FIG. 18, the base electrode 32 has the two base-electrode main portions 32A, and each of the two base-electrode main portions 32A is disposed between the two emitter mesa layers 25 adjacent widthwise to each other. In contrast in the modification illustrated in FIG. 19, the base-electrode main portions 32A are further disposed on an outside of the two emitter mesa layers 25 located outermost in the width direction, and the base electrode 32 has a total of four base-electrode main portions 32A. The four base-electrode main portions 32A is connected to the one base-electrode pad portion 32B.

In this modification, the base-electrode main portion 32A is disposed at each side of each of the three emitter mesa layers 25 in the width direction. Accordingly, substantial base resistance can be reduced in the three emitter mesa layers 25.

Still another modification of the third embodiment will be described. In the third embodiment, the emitter electrode 33 is disposed inward of the emitter mesa layer 25 in the plan view; however, the configuration in which the emitter electrode 33 projects to the outer side portion of the emitter mesa layer 25 may be used. This can be configured by using the self-alignment process in which, for example, the emitter electrode 33 is used as an etching mask to etch the semiconductor layer under the emitter electrode 33 and thereby to leave the emitter mesa layer 25.

Fourth Embodiment

A semiconductor device according to a fourth embodiment will be described with reference to FIG. 20. Hereinafter, the configuration common to the configuration of the semiconductor device according to the second embodiment (FIGS. 11 to 13) is not described.

Figure 20:
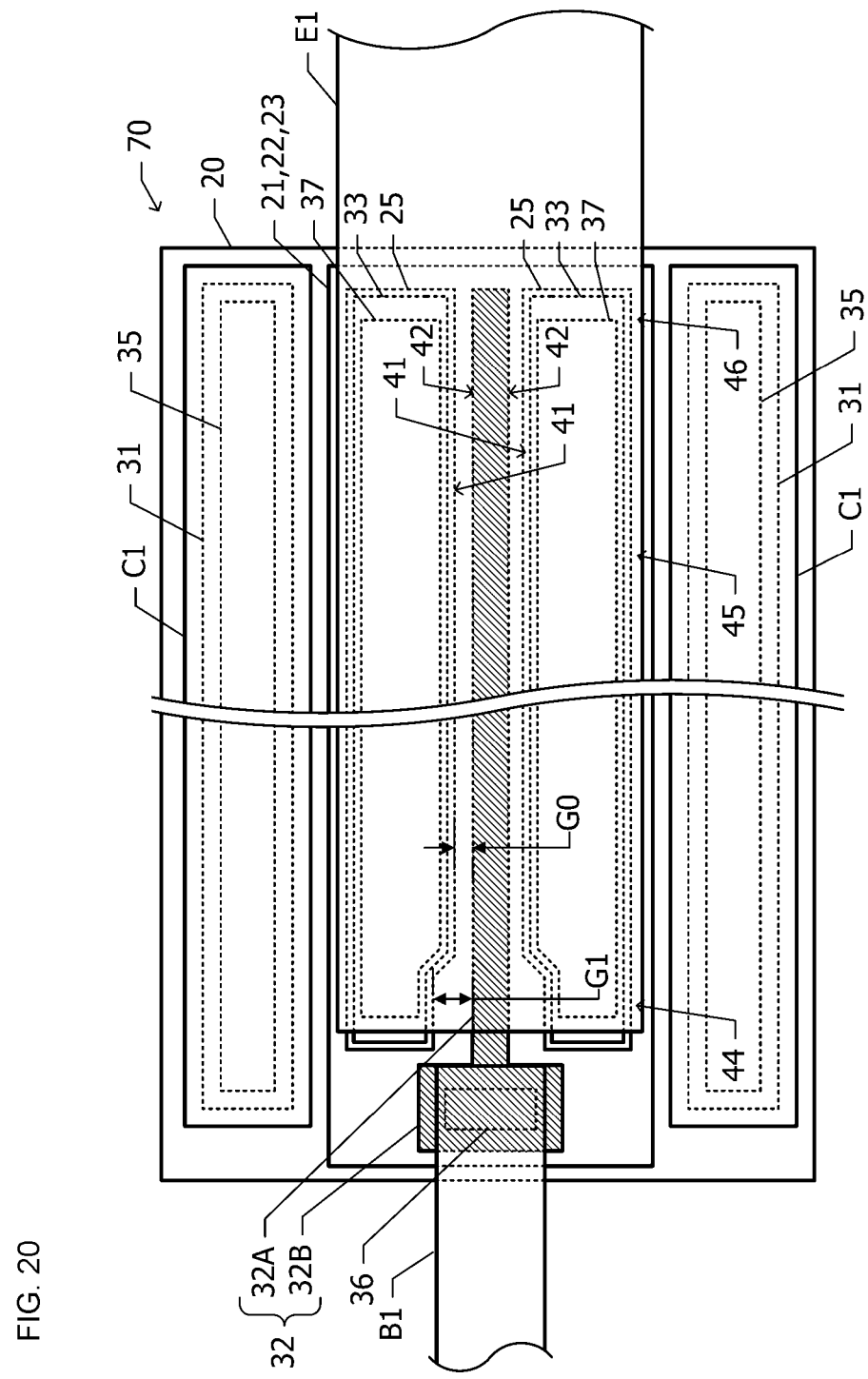
FIG. 20 is a plan view of one of a plurality of unit transistors included in a semiconductor device according to a fourth embodiment.

FIG. 20 is a plan view of one of a plurality of unit transistors 70 included in the semiconductor device according to the fourth embodiment. In the second embodiment, in the terminal portions 44 and 46 at the respective ends of the emitter mesa layer 25, each first edge 41 of the emitter mesa layer 25 is located at the position receded farther than the position of the first edge 41 in the intermediate portion 45 in the direction away from the corresponding second edge 42 of the base-electrode main portion 32A. In contrast in the fourth embodiment, only in the terminal portion 44 closer to the base-electrode pad portion 32B, the first edge 41 is located at the position receded farther than the position of the first edge 41 in the intermediate portion 45 in the direction away from the second edge 42. In the terminal portion 46 on the opposite side, the gap G1 is equal to the gap G0.

The excellent effects of the fourth embodiment will be described.

With respect to the emitter mesa layer 25, the presence of the base-electrode pad portion 32B largely deteriorates the thermal and electrical symmetry in the first direction. In the fourth embodiment, in the terminal portion 44 closer to the base-electrode pad portion 32B, each first edge 41 is located farther away from the base-electrode pad portion 32B than in the other portion of the emitter mesa layer 25. This can reduce the occurrence of the kink K (FIG. 3) attributable to the presence of the base-electrode pad portion 32B. As the result, it is possible to raise the transition voltage and enlarge the SOA.

A modification of the fourth embodiment will be described. In the fourth embodiment, the emitter electrode 33 is disposed inward of the emitter mesa layer 25 in the plan view; however, the configuration in which the emitter electrode 33 projects to the outer side portion of the emitter mesa layer 25 may be used. This can be configured by using the self-alignment process in which, for example, the emitter electrode 33 is used as an etching mask to etch the semiconductor layer under the emitter electrode 33 and thereby to leave the emitter mesa layer 25.

Further, in the fourth embodiment, the emitter mesa layer 25 have a larger area in the planar shape than that in the second embodiment. As the result, the amount of collector current can be increased.

Fifth Embodiment

A semiconductor device according to a fifth embodiment will be described with reference to FIGS. 21 and 22. Hereinafter, the configuration common to the configuration of the semiconductor device according to the second embodiment (FIGS. 11 to 13) is not described.

Figure 21:
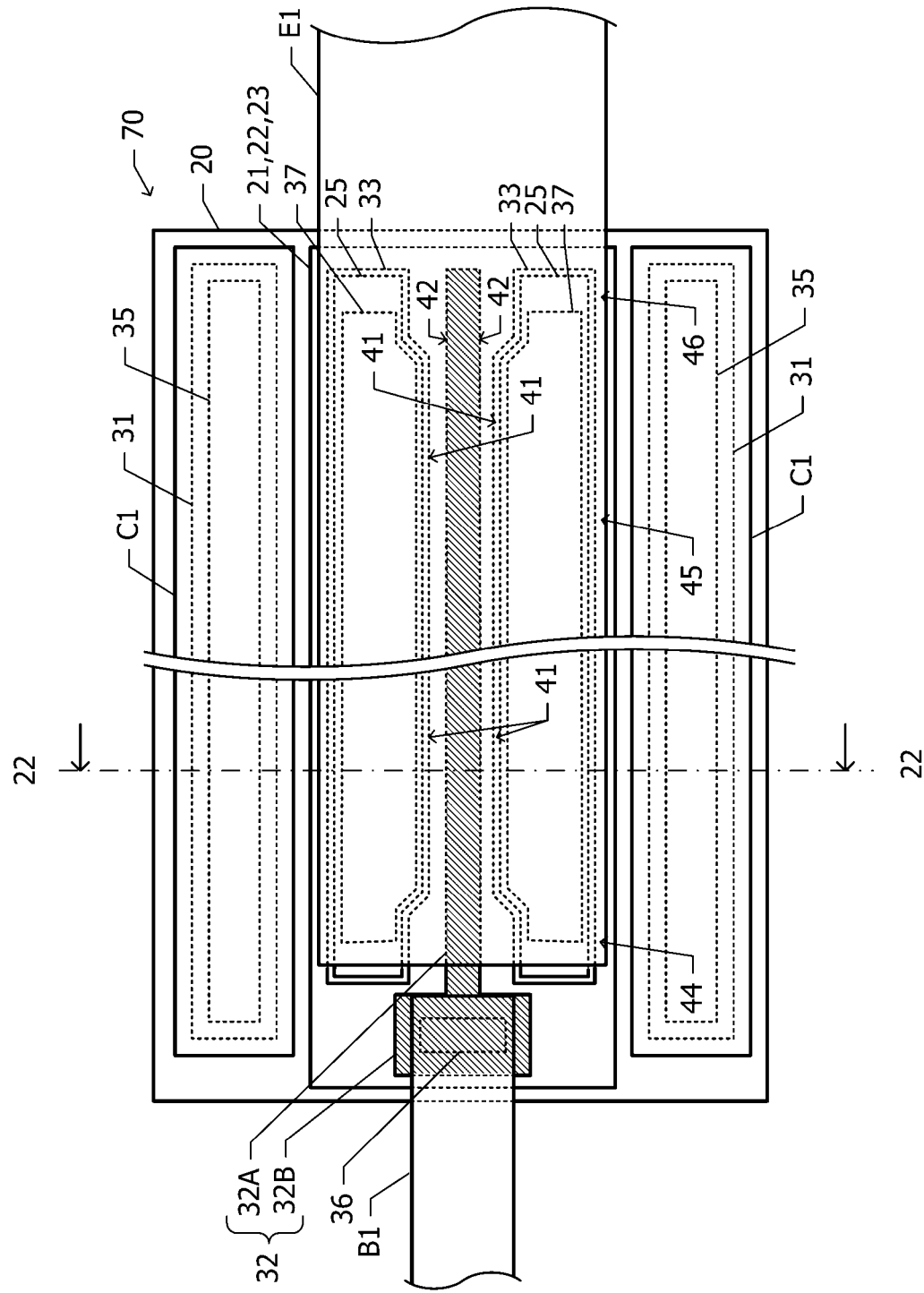
FIG. 21 is a plan view of one of a plurality of unit transistors included in a semiconductor device according to a fifth embodiment.

FIG. 21 is a plan view of one of a plurality of unit transistors 70 included in the semiconductor device according to the fifth embodiment. In the second embodiment, each emitter electrode 33 is disposed inward of the emitter mesa layer 25 (FIG. 11) in the plan view. In contrast in the fifth embodiment, each emitter electrode 33 projects to the outer side portion of the emitter mesa layer 25.

Figure 22:
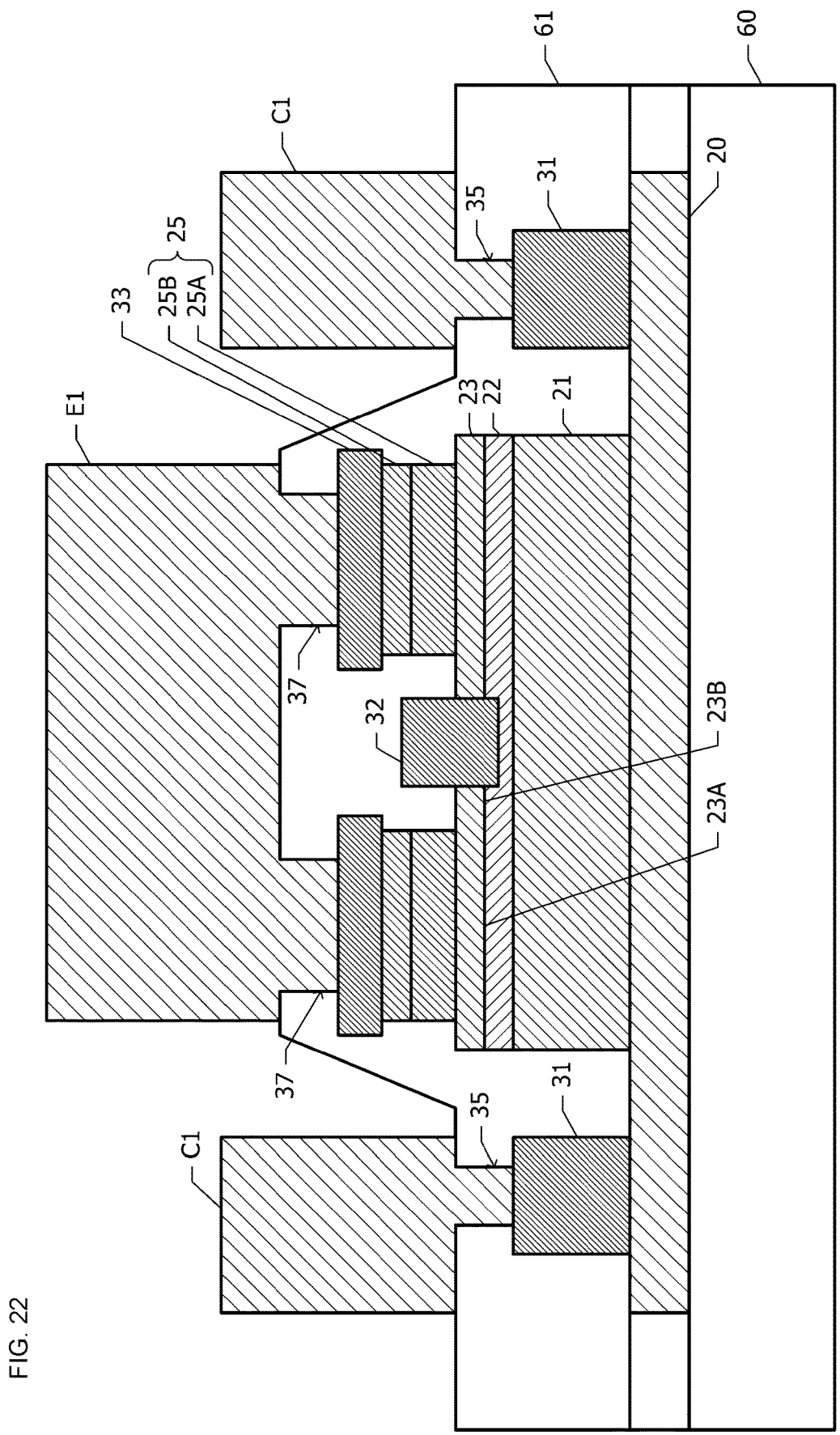
FIG. 22 is a cross-sectional view taken along the alternate long and short dash line 22-22 in FIG. 21.

FIG. 22 is a cross-sectional view taken along the alternate long and short dash line 22-22 in FIG. 21. The emitter electrode 33 is disposed on the emitter mesa layer 25. The emitter electrode 33 projects like an eave from each side of the emitter mesa layer 25 in a lateral direction. The emitter mesa layer 25 is dry-etched with the emitter electrode 33 used as an etching mask, and thereby patterning is performed. In the etching, gas for selectively etching the InGaAs contact layer 25B and the GaAs capping layer 25A for the InGaP emitter layer 23, for example, a CF system gas is used.

The excellent effects of the fifth embodiment will be described. Also in the fifth embodiment, shapes of and the positional relationship between the emitter mesa layer 25 and the base electrode 32 are the same as those in the second embodiment. Accordingly, the SOA can be enlarged like the second embodiment.

Further, the fifth embodiment uses the self-alignment process in which the emitter electrode 33 is used as an etching mask to perform patterning on the emitter mesa layer 25. Accordingly, one layer of a photomask can be omitted. As the result, the manufacturing cost can be reduced.

Sixth Embodiment

A semiconductor device according to a sixth embodiment will be described with reference to FIG. 23. Hereinafter, the configuration common to the configuration of the semiconductor device according to the second embodiment (FIGS. 11 to 13) is not described.

Figure 23:
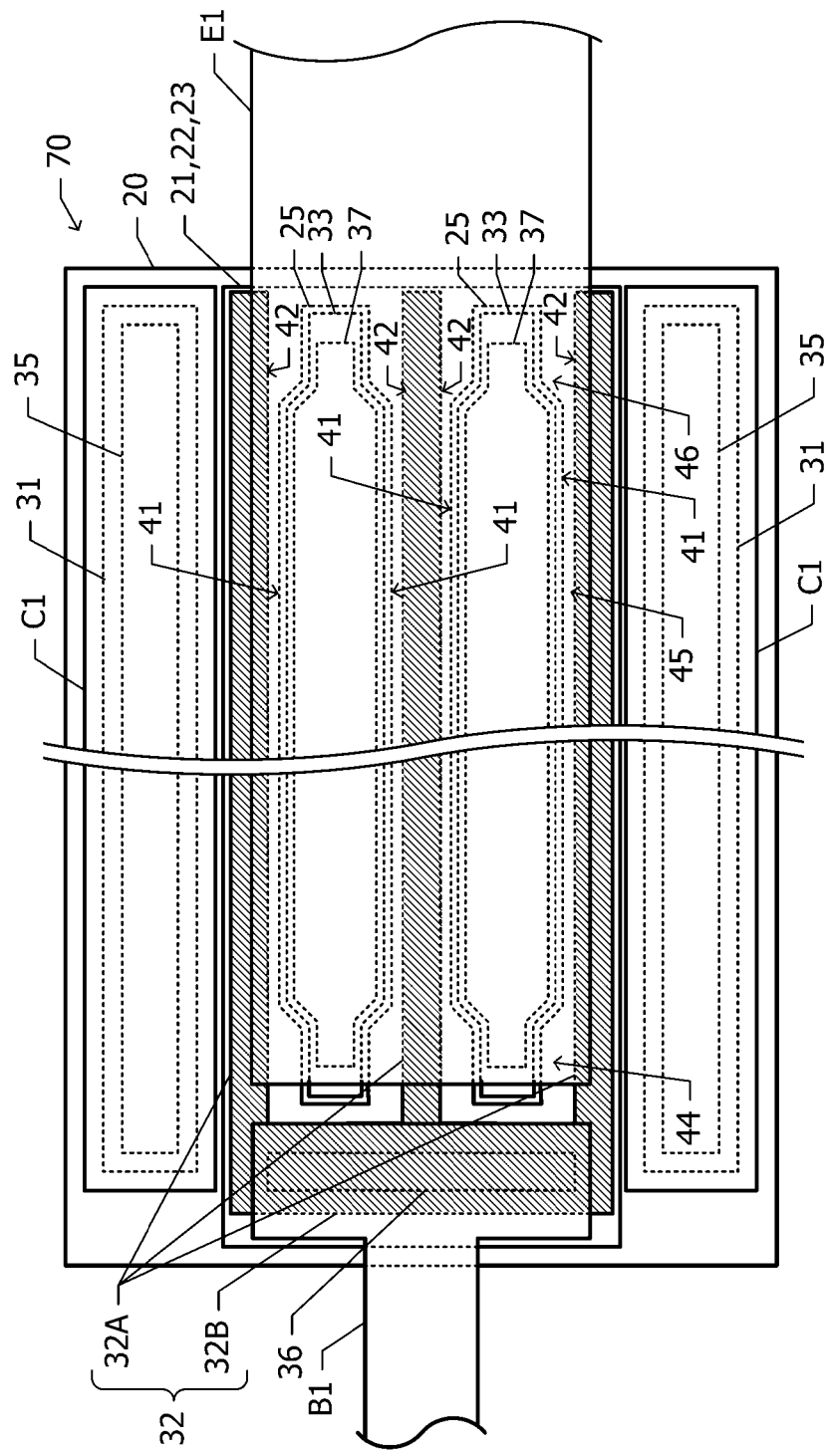
FIG. 23 is a plan view of one of a plurality of unit transistors included in a semiconductor device according to a sixth embodiment.

FIG. 23 is a plan view of one of a plurality of unit transistors 70 included in the semiconductor device according to the sixth embodiment. In the second embodiment, the one base-electrode main portion 32A is disposed between the two components of the emitter mesa layer 25 in the plan view. In contrast in the sixth embodiment, base-electrode main portions 32A are also disposed on an outside of the two components of the emitter mesa layer 25 in the second direction (width direction). The shapes of and the positional relationship between each first edge 41 of the emitter mesa layer 25 and the corresponding second edge 42 of the base-electrode main portion 32A facing the first edge 41 are the same as the shapes thereof and the positional relationship therebetween in the second embodiment.

The excellent effects of the sixth embodiment will be described.

Also in the sixth embodiment, the positional relationship between the first edge 41 of the emitter mesa layer 25 and the corresponding second edge 42 of the base-electrode main portion 32A facing the first edge 41 is the same as the positional relationship therebetween in the second embodiment, and the SOA can thus be enlarged like the second embodiment. Further, the base-electrode main portion 32A is disposed at each side of each component of the emitter mesa layer 25, and thus the base access resistance in the intermediate portion 45 of the emitter mesa layer 25 can be reduced.

A modification of the sixth embodiment will be described.

In the sixth embodiment, the double-emitter structure in which the emitter mesa layer 25 is composed of the two components is used; however, a triple emitter structure in which the emitter mesa layer 25 is composed of three components may be used. In this case, the four base-electrode main portion 32A are desirably disposed. Further, the emitter mesa layer 25 may be composed of four or more components.

Seventh Embodiment

A semiconductor device according to a seventh embodiment will be described with reference to FIG. 24. Hereinafter, the configuration common to the configuration of the semiconductor device according to the first embodiment (FIGS. 4 to 8) is not described.

Figure 24:
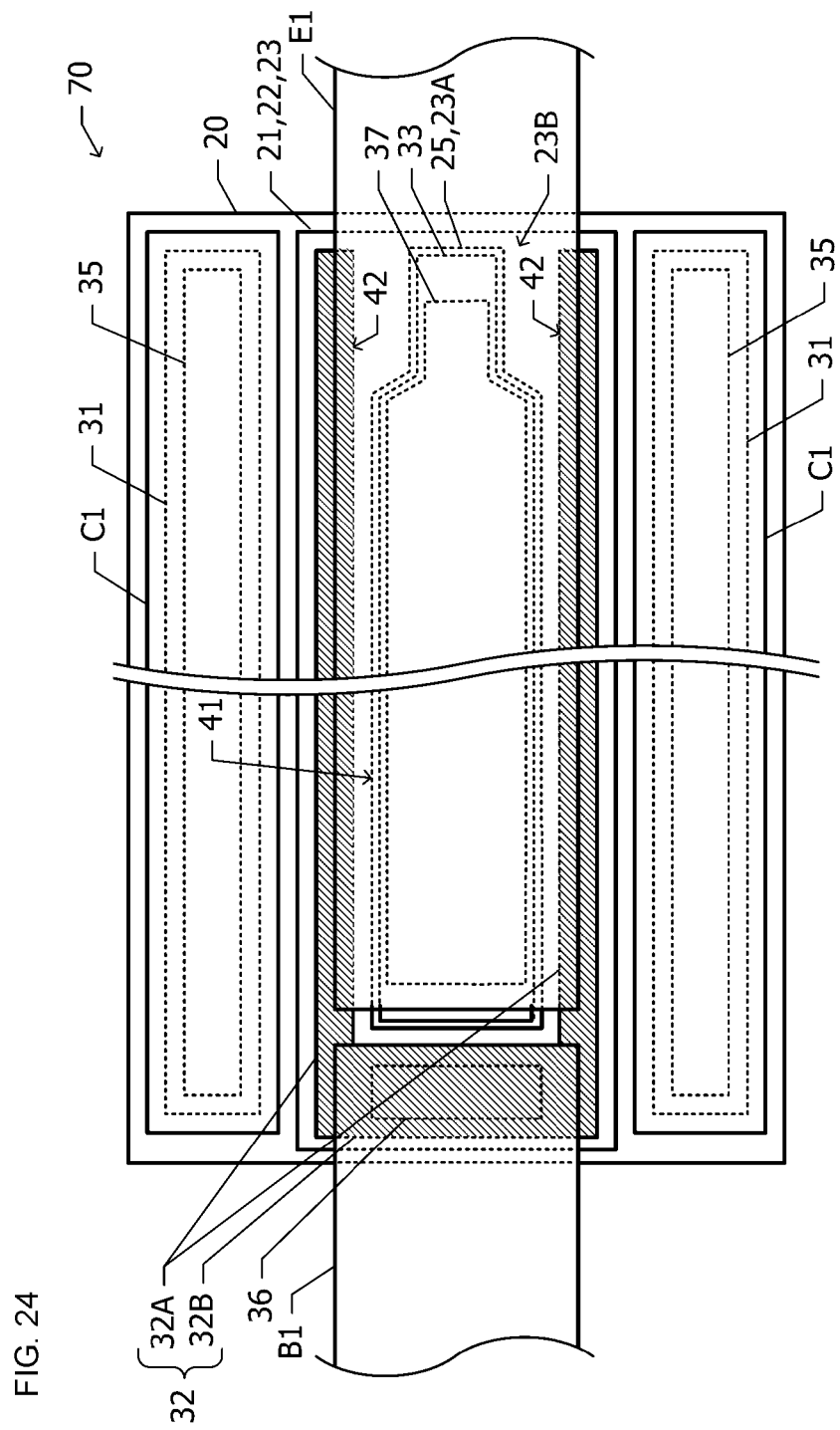
FIG. 24 is a plan view of a semiconductor device according to a seventh embodiment.

FIG. 24 is a plan view of the semiconductor device according to the seventh embodiment. In the first embodiment (FIG. 4), each first edge 41 of each of the two terminal portions 44 and 46 is located at the position receded farther than the position of the first edge 41 in the intermediate portion 45 in the direction away from the second edge 42 of the base-electrode main portion 32A. In contrast in the seventh embodiment, the first edge 41 in the terminal portion 44 closer to the base-electrode pad portion 32B and the first edge 41 in the intermediate portion 45 are located on one straight line. The first edge 41 in only the terminal portion 46 farther from the base-electrode pad portion 32B is located at the position receded farther than the position of the first edge 41 in the intermediate portion 45 in the direction away from the second edge 42 of the base-electrode main portion 32A.

The excellent effects of the seventh embodiment will be described.

In some cases, the thermal or electrical asymmetry factors cause the emitter current to tend to localize in the direction away from the base-electrode pad portion 32B at the time of high current. For example, in a case where the temperature tends to rise on a side opposite from the base-electrode pad portion 32B with respect to the emitter mesa layer 25, the emitter current tends to localize in the direction away from the base-electrode pad portion 32B. If the seventh embodiment is used in the case where the tendency as described above is exhibited, the emitter current is less likely to localize. As the result, it is possible to raise the transition voltage and enlarge the SOA.

The above-described embodiments are provided for an illustrative purpose, and it goes without saying that the configuration illustrated in different embodiments can be partially replaced or combined. The same operations and effects of the same configuration of the plurality of embodiments are not referred to in each embodiment one by one. Further, the present disclosure is not limited to the above-described embodiments. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a collector layer;
a base layer;
an emitter layer;
an emitter mesa layer disposed in a partial region of the emitter layer,
the collector layer, the base layer, the emitter layer, and the emitter mesa layer being disposed above a substrate,
the collector layer, the base layer, and the emitter layer being stacked in this order, and
the emitter mesa layer having a first edge extending in a first direction in a plan view; and
a base electrode disposed in or on a region which does not overlap the emitter mesa layer in the plan view and that allows base current to flow to the base layer,
the base electrode having a second edge extending in the first direction in the plan view, the second edge of the base electrode facing the first edge of the emitter mesa layer,
wherein a gap between the first edge and the second edge in a terminal portion located in an end portion of the emitter mesa layer in the first direction is wider than a gap between the first edge of the emitter mesa layer and the second edge in an intermediate portion of the emitter mesa layer in the first direction, and
wherein at least a part of the first edge of the emitter mesa layer is parallel to at least a part of the second edge of the base electrode in a terminal portion located in an end portion of the emitter mesa layer.

2. The semiconductor device according to claim 1, further comprising
a base wiring line disposed in a layer higher than the base electrode, and
wherein
the base electrode includes a base-electrode pad portion and a base-electrode main portion extending from the base-electrode pad portion in the first direction, the base-electrode pad portion is disposed away in the first direction from the end portion of the emitter mesa layer in the first direction, and the base-electrode pad portion is connected to the base wiring line, and
the terminal portion includes a first terminal portion and a second terminal portion, the first terminal portion being closer to the base-electrode pad portion than a second terminal portion of the emitter mesa layer, a gap between the first edge and the second edge in the first terminal portion of the emitter mesa layer is wider than the gap between the first edge and the second edge in the intermediate portion of the emitter mesa layer in the first direction.

3. The semiconductor device according to claim 2, wherein a gap between the first edge and the second edge in the second terminal portion of the emitter mesa layer is wider than the gap between the first edge and the second edge in the intermediate portion of the emitter mesa layer in the first direction, the second terminal portion being farther from the base-electrode pad portion than the first terminal portion.

4. The semiconductor device according to claim 2, wherein
the second edge extends in the first direction, and
the first edge in the first terminal portion of the emitter mesa layer is located at a position receded farther in a direction away from the second edge than a position of the first edge in the intermediate portion in the first direction.

5. The semiconductor device according to claim 2, wherein
the first edge extends in the first direction, and
in the first terminal portion of the emitter mesa layer, the second edge is located at a position receded farther in a direction away from the first edge than a position of the second edge facing the intermediate portion in the first direction.

6. The semiconductor device according to claim 2, wherein
in the first terminal portion of the emitter mesa layer, a dimension in the first direction of a portion where the gap between the first edge and the second edge is wider than the gap between the first edge and the second edge in the intermediate portion is longer than or equal to about 0.5 µm.

7. The semiconductor device according to claim 2, wherein
in the first terminal portion of the emitter mesa layer, the gap between the first edge and the second edge is wider than the gap between the first edge and the second edge in the intermediate portion by about 0.3 µm or longer.

8. The semiconductor device according to claim 2, wherein
the emitter mesa layer has at least two components in the plan view, and the two components of the emitter mesa layer each have a planar shape extending in the first direction and are placed so as to be spaced away from each other in a second direction orthogonal to the first direction,
the base-electrode main portion is disposed between the two components of the emitter mesa layer in the plan view, and
edges of the two respective components of the emitter mesa layer each forms the first edge, the edges facing the base-electrode main portion, and edges of the base-electrode main portion that respectively face the two components of the emitter mesa layer each forms the second edge.

9. The semiconductor device according to claim 2, further comprising:
an emitter electrode disposed on the emitter mesa layer; and
an emitter wiring line disposed in a layer that is higher than the emitter electrode and that is flush with the base wiring line, the emitter wiring line being connected to the emitter electrode,
wherein in the plan view, a shortest distance from an edge of the base-electrode pad portion to an edge of the emitter wiring line is longer than a shortest distance from the edge of the base-electrode pad portion to an edge of the emitter mesa layer.

10. The semiconductor device according to claim 9, wherein
in the plan view, the emitter electrode is projected outward from the edge of the emitter mesa layer.

11. The semiconductor device according to claim 1, further comprising:
an emitter electrode disposed on the emitter mesa layer, wherein in the plan view, the emitter electrode is projected outward from the edge of the emitter mesa layer.

12. The semiconductor device according to claim 3, wherein
the second edge extends in the first direction, and
the first edge in the first terminal portion of the emitter mesa layer is located at a position receded farther in a direction away from the second edge than a position of the first edge in the intermediate portion in the first direction.

13. The semiconductor device according to claim 3, wherein
the first edge extends in the first direction, and
in the first terminal portion of the emitter mesa layer, the second edge is located at a position receded farther in a direction away from the first edge than a position of the second edge facing the intermediate portion in the first direction.

14. The semiconductor device according to claim 3, wherein
in the first terminal portion of the emitter mesa layer, a dimension in the first direction of a portion where the gap between the first edge and the second edge is wider than the gap between the first edge and the second edge in the intermediate portion is longer than or equal to about 0.5 µm.

15. The semiconductor device according to claim 4, wherein
in the first terminal portion of the emitter mesa layer, a dimension in the first direction of a portion where the gap between the first edge and the second edge is wider than the gap between the first edge and the second edge in the intermediate portion is longer than or equal to about 0.5 µm.

16. The semiconductor device according to claim 3, wherein
in the first terminal portion of the emitter mesa layer, the gap between the first edge and the second edge is wider than the gap between the first edge and the second edge in the intermediate portion by about 0.3 µm or longer.

17. The semiconductor device according to claim 3, wherein
the emitter mesa layer has at least two components in the plan view, and the two components of the emitter mesa layer each have a planar shape extending in the first direction and are placed so as to be spaced away from each other in a second direction orthogonal to the first direction,
the base-electrode main portion is disposed between the two components of the emitter mesa layer in the plan view, and
edges of the two respective components of the emitter mesa layer each forms the first edge, the edges facing the base-electrode main portion, and edges of the base-electrode main portion that respectively face the two components of the emitter mesa layer each forms the second edge.

18. The semiconductor device according to claim 3, further comprising:

an emitter electrode disposed on the emitter mesa layer; and an emitter wiring line disposed in a layer that is higher than the emitter electrode and that is flush with the base wiring line, the emitter wiring line being connected to the emitter electrode, wherein in the plan view, a shortest distance from an edge of the base-electrode pad portion to an edge of the emitter wiring line is longer than a shortest distance from the edge of the base-electrode pad portion to an edge of the emitter mesa layer.

19. The semiconductor device according to claim 18, wherein in the plan view, the emitter electrode is projected outward from the edge of the emitter mesa layer.

20. The semiconductor device according to claim 2, further comprising:

an emitter electrode disposed on the emitter mesa layer, wherein in the plan view, the emitter electrode is projected outward from the edge of the emitter mesa layer.

* * * * *